US012315814B2

(12) United States Patent
Yu et al.

(10) Patent No.: US 12,315,814 B2
(45) Date of Patent: May 27, 2025

(54) SEMICONDUCTOR DEVICE AND ELECTRONIC SYSTEM INCLUDING SAME

(71) Applicant: SAMSUNG ELECTRONICS CO., LTD., Suwon-si (KR)

(72) Inventors: Chung-Ho Yu, Hwaseong-si (KR); Hongsoo Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 482 days.

(21) Appl. No.: 17/704,701

(22) Filed: Mar. 25, 2022

(65) Prior Publication Data
US 2023/0080436 A1 Mar. 16, 2023

(30) Foreign Application Priority Data
Sep. 10, 2021 (KR) .................. 10-2021-0121298

(51) Int. Cl.
*H10B 41/27* (2023.01)
*H01L 23/535* (2006.01)
*H10B 41/41* (2023.01)
*H10B 43/27* (2023.01)
*H10B 43/40* (2023.01)

(52) U.S. Cl.
CPC .......... *H01L 23/535* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| 8,476,713 | B2 | 7/2013 | Lee et al. | |
|---|---|---|---|---|
| 9,419,009 | B1 | 8/2016 | Oh et al. | |
| 9,837,419 | B2 | 12/2017 | Oh et al. | |
| 2016/0351243 | A1* | 12/2016 | Ishizu | H01L 27/1255 |
| 2017/0373084 | A1 | 12/2017 | Shim et al. | |
| 2019/0157292 | A1* | 5/2019 | Kim | G11C 16/24 |
| 2020/0279863 | A1* | 9/2020 | Liu | H01L 29/40117 |

(Continued)

FOREIGN PATENT DOCUMENTS

| KR | 10-2016-0096309 A | 8/2016 |
|---|---|---|
| KR | 10-2016-0112780 A | 9/2016 |

(Continued)

*Primary Examiner* — Xiaoming Liu
(74) *Attorney, Agent, or Firm* — Fish & Richardson P.C.

(57) ABSTRACT

A semiconductor device includes; a first transistor on a substrate and including a first gate electrode, a second transistor on the substrate and including a second gate electrode adjacent to the first gate electrode, an electrode structure including electrodes vertically stacked on the first and second transistors and including first and second pads adjacent to in the first direction, first and second landing pads between the substrate and the electrode structure connected respectively to the first and second landing pads, a first penetration electrode penetrating the electrode structure to connect the first landing pad and the first pad, a second penetration electrode penetrating the electrode structure to connect the second landing pad and the second pad, and lower interconnection lines between the first landing pad and the second landing pad and extending in a second direction substantially perpendicular to the first direction.

19 Claims, 30 Drawing Sheets

(56) References Cited

U.S. PATENT DOCUMENTS

| | | | |
|---|---|---|---|
| 2020/0312830 A1 | 10/2020 | Oh et al. | |
| 2020/0350287 A1* | 11/2020 | Liu | ........................ H01L 24/32 |
| 2020/0388630 A1 | 12/2020 | Yun et al. | |
| 2021/0057444 A1 | 2/2021 | Park et al. | |
| 2021/0098367 A1 | 4/2021 | Lee | |
| 2021/0183446 A1 | 7/2021 | Park | |

FOREIGN PATENT DOCUMENTS

| | | |
|---|---|---|
| KR | 10-2018-0001296 A | 1/2018 |
| KR | 10-2020-0082709 A | 7/2020 |
| KR | 10-2020-0140139 A | 12/2020 |
| KR | 10-2021-0022797 A | 3/2021 |
| KR | 10-2021-0039183 A | 4/2021 |

\* cited by examiner

SEMICONDUCTOR DEVICE AND ELECTRONIC SYSTEM INCLUDING SAME

CROSS-REFERENCE TO RELATED APPLICATION

This U.S. non-provisional patent application claims priority under 35 U.S.C. § 119 to Korean Patent Application No. 10-2021-0121298 filed on Sep. 10, 2021 in the Korean Intellectual Property Office, the subject matter of which is hereby incorporated by reference in its entirety.

BACKGROUND

The inventive concept relates generally to semiconductor devices and electronic systems including semiconductor device(s).

Higher integration of semiconductor devices is required to satisfy consumer-driven demands for electronic systems providing enhanced performance and reduced price points. Semiconductor device integration density is an important consideration in determining overall cost, performance and physical size. In the case of two-dimensional or planar semiconductor devices, integration is primarily determined by the area (or lateral footprint) occupied by a unit memory cell. In this regard, the integration density of semiconductor devices is greatly influenced by the level of a fine pattern formation technologies. However, extremely expensive processing equipment is required to further increase pattern fineness. And such expenditures have become practical limits on the degree to which two-dimensional semiconductor devices may be further integrated. Accordingly, three-dimensional semiconductor memory devices including three-dimensionally arranged memory cells have been the subject of considerable research and development.

SUMMARY

Embodiments of the inventive concept provide semiconductor devices exhibiting improved reliability and increased integration density. Other embodiments of the inventive concept provide electronic systems including such semiconductor device(s).

According to an embodiment of the inventive concept, a semiconductor device may include; a first transistor on a substrate and including a first gate electrode, a second transistor on the substrate and including a second gate electrode adjacent to the first gate electrode in a first direction, an electrode structure including electrodes vertically stacked on the first transistor and the second transistor, wherein the electrode structure includes a first pad and a second pad adjacent to each other in the first direction, a first landing pad and a second landing pad between the substrate and the electrode structure, the first landing pad connected to the first transistor, and the second landing pad connected to the second transistor, a first penetration electrode penetrating the electrode structure to connect the first landing pad and the first pad, a second penetration electrode penetrating the electrode structure to connect the second landing pad and the second pad, and lower interconnection lines between the first landing pad and the second landing pad and extending in a second direction substantially perpendicular to the first direction.

According to an embodiment of the inventive concept, a semiconductor device may include; a substrate including a cell array region and a connection region arranged in a first direction, a device isolation layer on the connection region and defining a first active region and a second active region adjacent to each other in the first direction, a first transistor on the first active region and including a first gate electrode, a second transistor on the second active region and including a second gate electrode, an electrode structure including electrodes vertically stacked on the cell array region and the connection region, wherein the electrode structure includes pads disposed on the connection region in a staircase structure, and the pads include a first pad on the first gate electrode and a second pad on the second gate electrode, vertical channel structures on the cell array region and penetrating the electrode structure, landing pads between the substrate and the electrode structure and including a first landing pad connected to the first transistor and a second landing pad connected to the second transistor, a first penetration electrode penetrating the electrode structure to connect the first landing pad and the first pad, a second penetration electrode penetrating the electrode structure to connect the second landing pad and the second pad, lower interconnection lines between the first and second landing pads, and a lower plug connecting the second transistor and at least one of the lower interconnection lines.

According to an embodiment of the inventive concept, an electronic system may include; a main substrate, a semiconductor device on the main substrate, and a controller provided on the main substrate and electrically connected to the semiconductor device. The semiconductor device may includes; a first transistor on a substrate and including a first gate electrode, a second transistor on the substrate and including a second gate electrode adjacent to the first gate electrode in a first direction, an electrode structure including electrodes vertically stacked on the first transistor and the second transistor, wherein the electrode structure includes a first pad and a second pad adjacent to each other in the first direction, a first landing pad and a second landing pad between the substrate and the electrode structure, wherein the first landing pad is connected to the first transistor and the landing pad is connected to the second transistor, a first penetration electrode penetrating the electrode structure to connect the first landing pad and the first pad, a second penetration electrode penetrating the electrode structure to connect the second landing pad and the second pad; and lower interconnection lines between the first landing pad and the second landing pad.

BRIEF DESCRIPTION OF THE DRAWINGS

Advantages and features, as well as the making and use of the inventive concept may be more clearly understood upon consideration of the following detailed description together with the accompanying drawings, in which.

DETAILED DESCRIPTION

Throughout the written description an drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Further in this regard, certain embodiments including illustrated embodiments, or aspects of certain embodiments, may be described in relation to an arbitrarily selected space defined in terms of a first direction D1, a second direction D2 and a third direction D3. In some embodiments the first direction D1 may be a first horizontal direction, the second direction D2 may be a second horizontal direction intersecting the first horizontal direction, and the third direction D3 may be a vertical direction substantially orthogonal to the first and second horizontal directions. Those skilled in the art will recognize, however, that such directional description is provided merely for additional clarity explanation and/or illustration.

Figure 1:
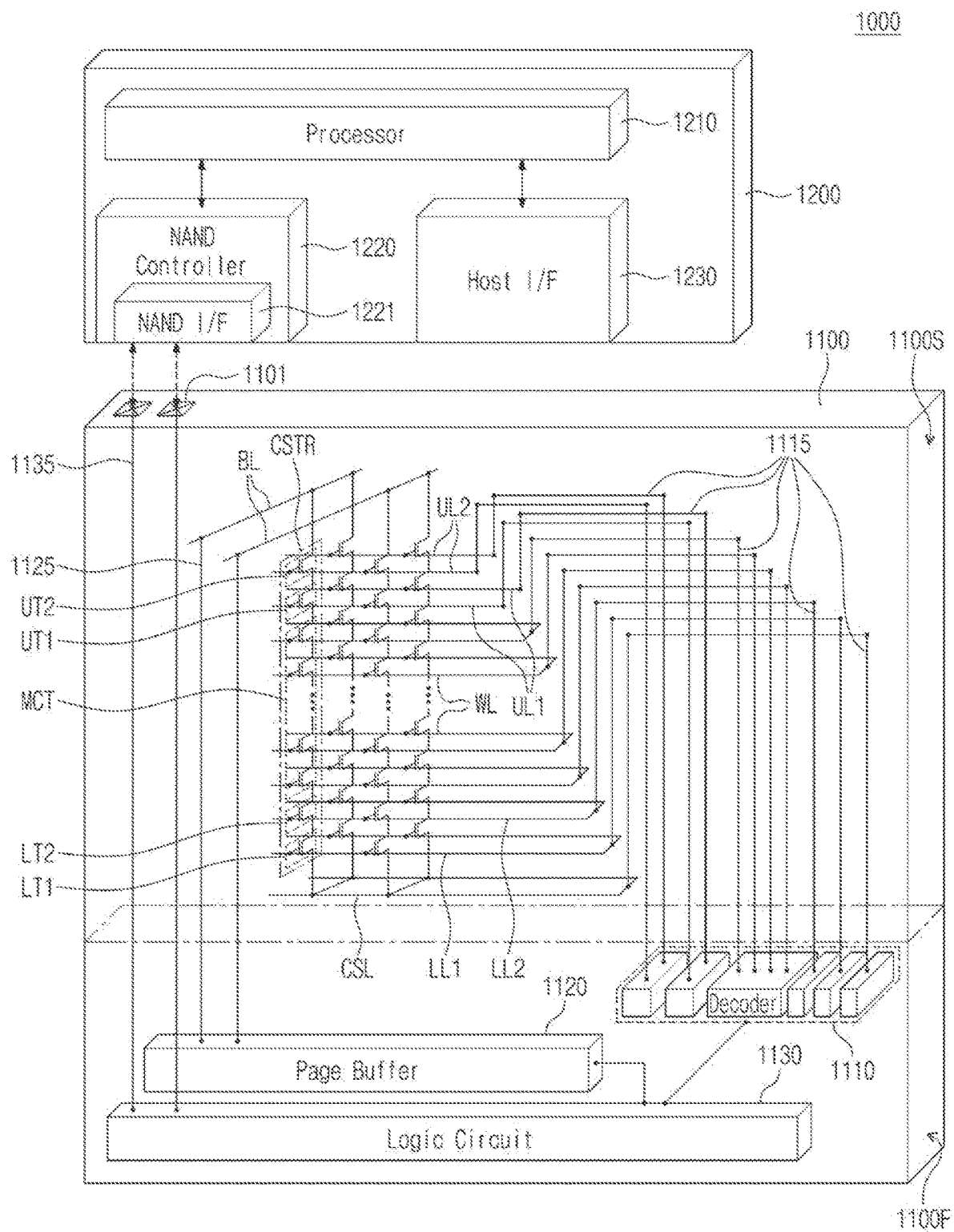
FIG. 1 is a block diagram illustrating an electronic system including a semiconductor device according to embodiments of the inventive concept.

FIG. 1 is a block diagram illustrating an electronic system 1000 including one or more semiconductor device(s) according to embodiments of the inventive concept.

Referring to FIG. 1, the electronic system 1000 may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND flash memory device). The semiconductor device 1100 may include a first structure 1100F and a second structure 1100S on the first structure 1100F. As an example, the first structure 1100F may be disposed beside (or laterally disposed in relation to) the second structure 1100S. The first structure 1100F may be a peripheral circuit structure including a decoder circuit portion 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to embodiments.

In some embodiments, at least one of the upper transistors UT1 and UT2 may include a string selection transistor, and at least one of the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In some embodiments, the lower transistors LT1 and LT2 may include a lower erase control transistor LT1 and a ground selection transistor LT2 connected in series. The upper transistors UT1 and UT2 may include a string selection transistor UT1 and an upper erase control transistor UT2 connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit portion 1110 through first connection lines 1115, and which extend from the first structure 1100F to the second structure 1100S. The bit lines BL may be electrically connected to the page buffer 1120 through second connection lines 1125 and extend from the first structure 1100F to the second structure 1100S.

In the first structure 1100F, the decoder circuit portion 1110 and the page buffer 1120 may be configured to perform a control operation on at least selected one of the memory cell transistors MCT. The decoder circuit portion 1110 and the page buffer 1120 may be controlled by the logic circuit 1130. The semiconductor device 1100 may communicate with the controller 1200 through an input/output (I/O) pad 1101, which is electrically connected to the logic circuit 1130. The I/O pad 1101 may be electrically connected to the logic circuit 1130 through an I/O connection line 1135, which is extended from the first structure 1100F to the second structure 1100S.

The controller 1200 may include a processor 1211, a NAND controller 1220, and a host interface 1230. In some embodiments, the electronic system 1000 may include a plurality of semiconductor devices 1100, and in this case, the controller 1200 may control the semiconductor devices 1100.

The processor 1211 may control overall operations of the electronic system 1000 including the controller 1200. The processor 1211 may be operated based on a specific firmware and may control the NAND controller 1220 to access the semiconductor device 1100. The NAND controller 1220 may include a NAND interface 1221 which is used for communication with the semiconductor device 1100. The NAND interface 1221 may be used to communicate (e.g., transmit and/or receive) control commands used to control the semiconductor device 1100, write data to-be-written to, or read data retrieved from the memory cell transistors MCT of the semiconductor device 1100, etc. The host interface 1230 may be configured to allow for communication between the electronic system 1000 and an external host. When a control command is received from the external host through the host interface 1230, the processor 1211 may control the semiconductor device 1100 in response to the control command.

Figure 2:
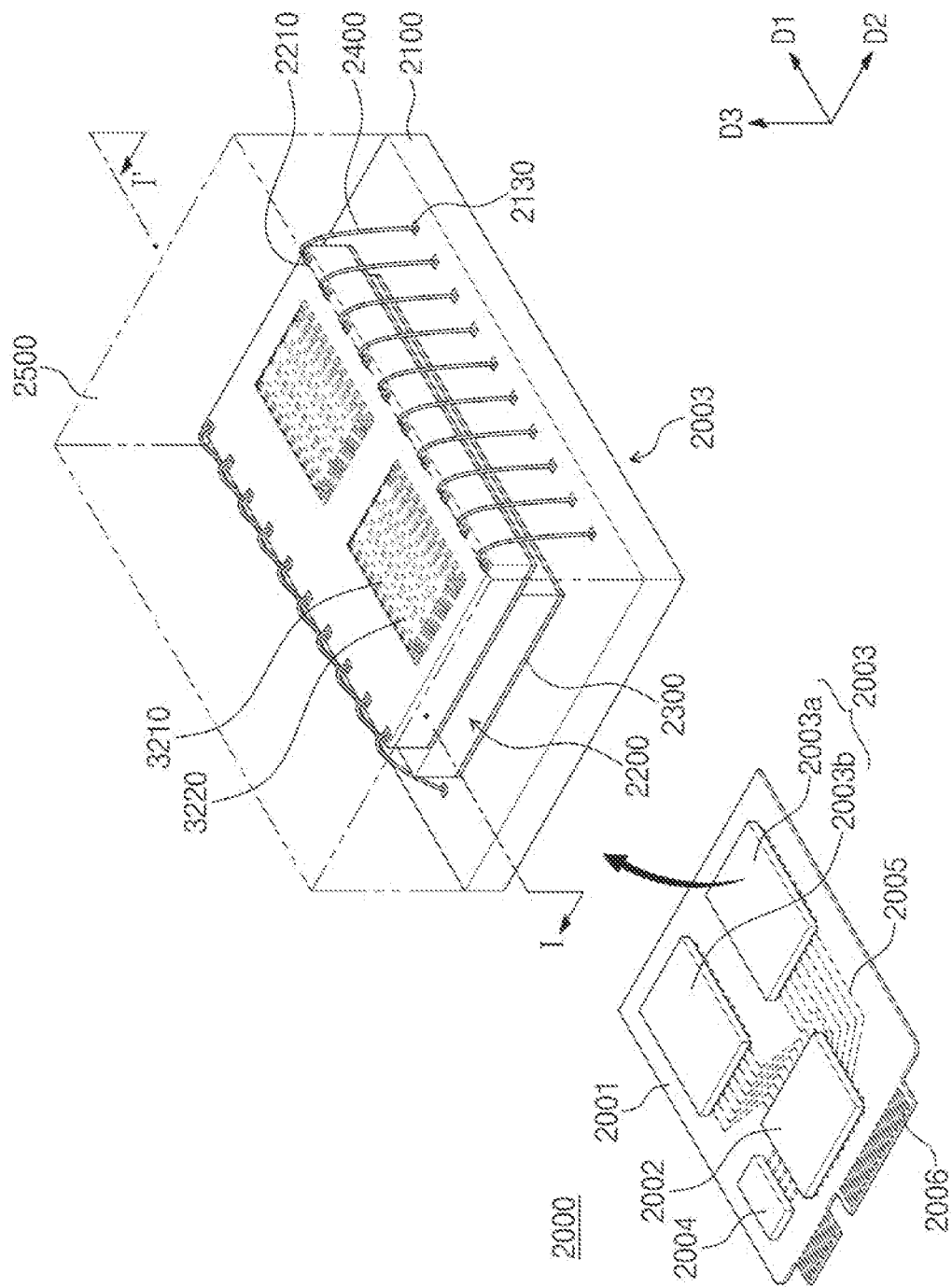
FIG. 2 is a perspective view further illustrating an electronic system including a semiconductor device according to embodiments of the inventive concept.

FIG. 2 is a perspective view illustrating an electronic system 2000 including a semiconductor device according to embodiments of the inventive concept.

Referring to FIG. 2, the electronic system 2000 may include a main substrate 2001 and a controller 2002, at least one semiconductor package 2003, and a Dynamic Random Access Memory (RAM) (DRAM) 2004 respectively mounted (e.g., mechanically assembled and/or electrically connected) on the main substrate 2001. The semiconductor package 2003 and the DRAM 2004 may be connected to the controller 2002 through interconnection patterns 2005 formed in the main substrate 2001.

The main substrate 2001 may include a connector 2006 including a plurality of pins variously connecting an external host. In the connector 2006, the number and arrangement of the pins may depend on a communication interface between the electronic system 2000 and the external host. In some embodiments, the electronic system 2000 may communicate with the external host, in accordance with one of interfaces, such as Universal Serial Bus (USB), Peripheral Component Interconnect express (PCI-Express), Serial Advanced Technology Attachment (SATA), Universal Flash Storage (UFS) M-PHY, or the like. In some embodiments, the electronic system 2000 may be driven by one or more power voltages which may be supplied from the external host through the connector 2006. The electronic system 2000 may further include a Power Management Integrated Circuit (PMIC) configured to separately supply power (e.g., power derived from an externally provided source, or host) to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory relieving technical difficulties caused by a difference in speed between the semiconductor package 2003, which serves as a data storage device, and an external host. In some embodiments, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003a and 2003b which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board (PCB) including package upper pad portions 2130. Each of the semiconductor chips 2200 may include an I/O pad portion 2210. The I/O pad portion 2210 may correspond to the I/O pad 1101 of FIG. 1. Each of the semiconductor chips 2200 may include gate stacks 3210 and vertical structures 3220. Each of the semiconductor chips 2200 may include a semiconductor device, which will be described hereafter, according to embodiments of the inventive concept.

In some embodiments, the connection structure 2400 may be a bonding wire electrically connecting the I/O pad portion 2210 to the package upper pad portions 2130. In each of the first and second semiconductor packages 2003a and 2003b, the semiconductor chips 2200 may be electrically connected to each other in a bonding wire manner and may be electrically connected to the package upper pad portions 2130 of the package substrate 2100. In some embodiments, the semiconductor chips 2200 in each of the first and second semiconductor packages 2003a and 2003b may be electrically connected to each other by a connection structure including through silicon vias (TSVs), and not by the connection structure 2400 provided in the form of bonding wires.

In some embodiments, the controller 2002 and the semiconductor chips 2200 may be included in a single package. In some embodiments, the controller 2002 and the semiconductor chips 2200 may be mounted on a separate interposer substrate, which is prepared independent of the main substrate 2001, and may be connected to each other through interconnection lines provided in the interposer substrate.

Figure 3A:
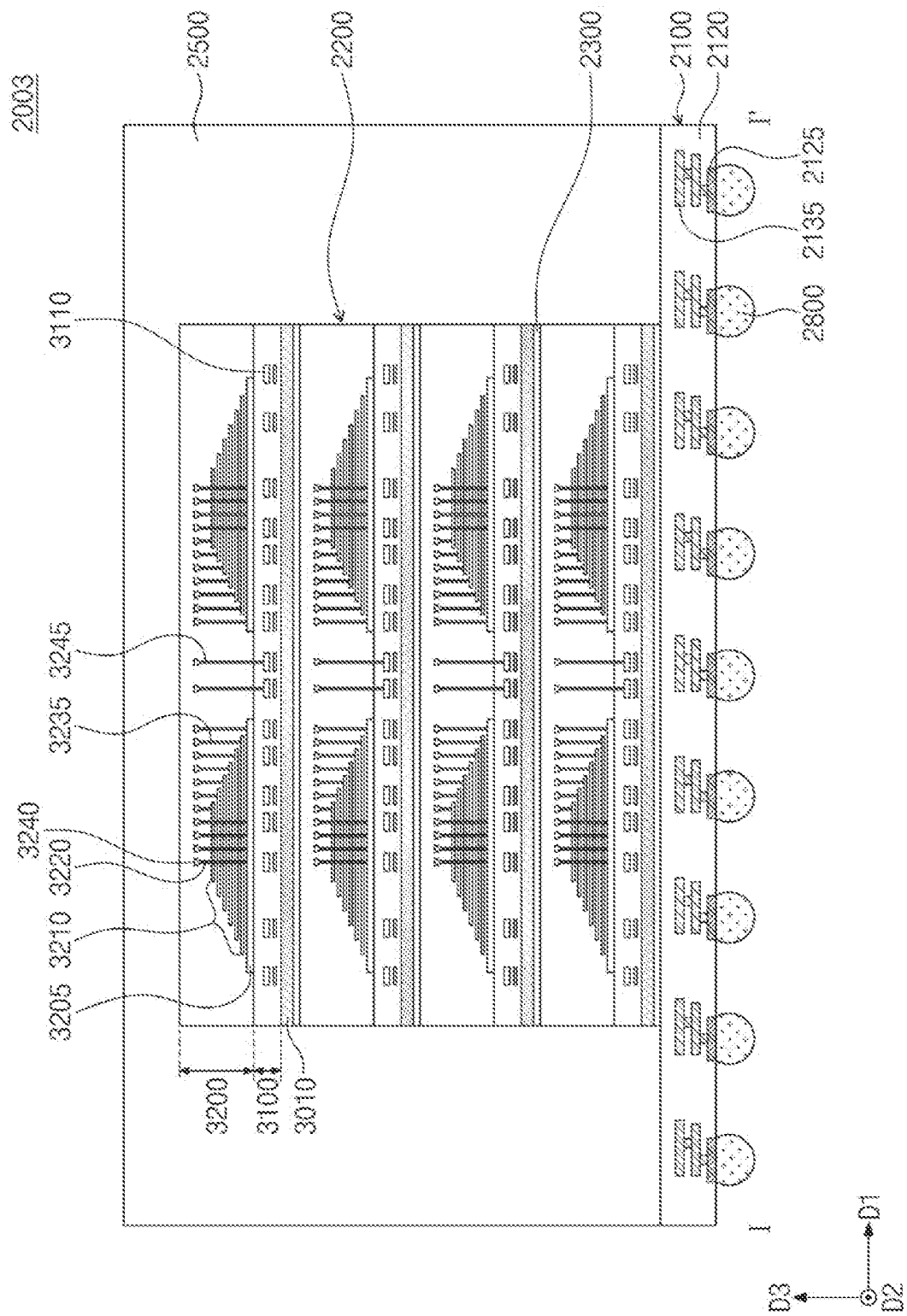
FIGS. 3A and 3B are respective cross-sectional views illustrating a semiconductor package according to embodiments of the inventive concept.
Figure 3B:
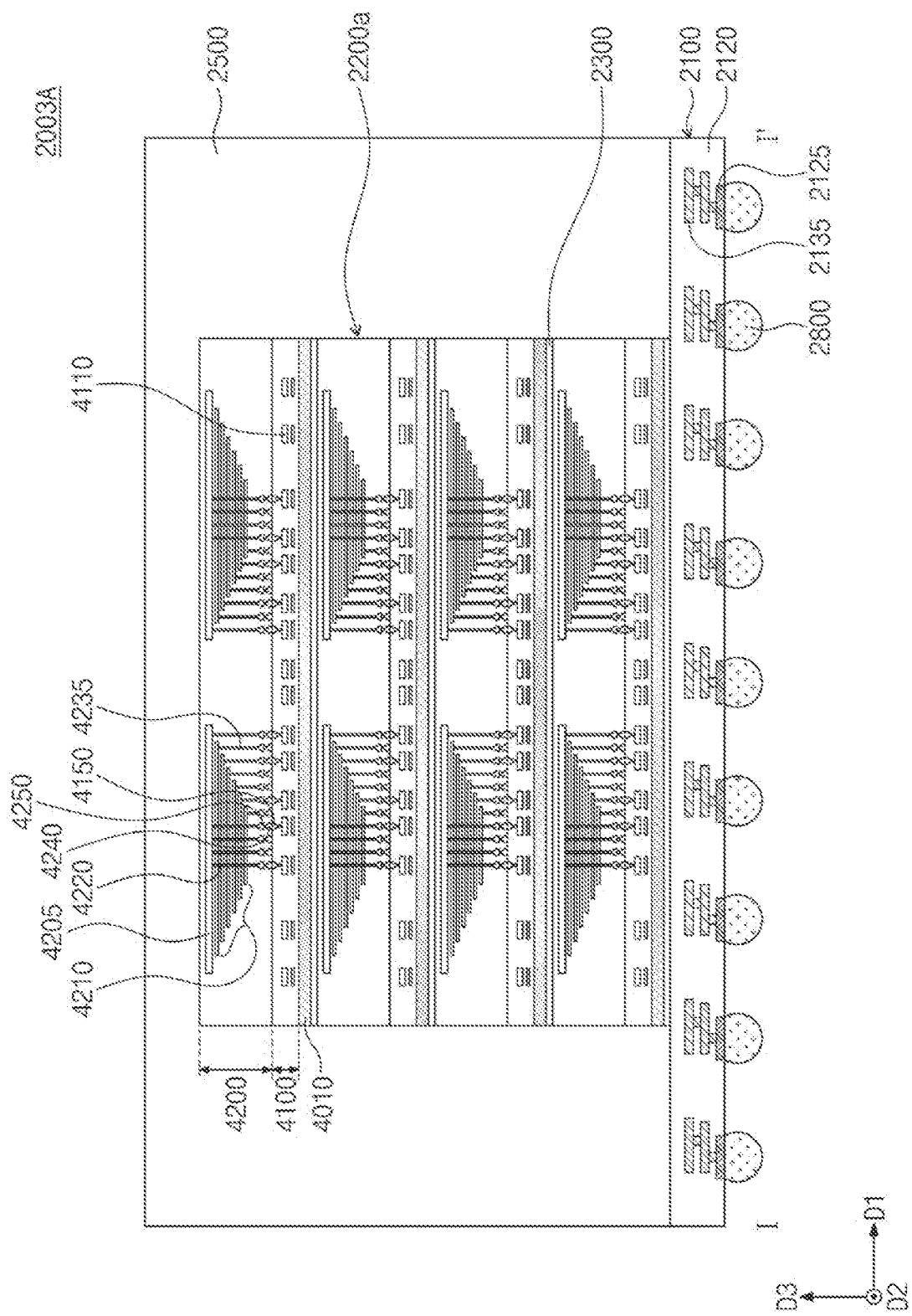

FIGS. 3A and 3B are respective cross-sectional views illustrating semiconductor packages 2003 and 2003a according to embodiments of the inventive concept. Here, FIGS. 3A and 3B conceptually illustrate different examples of the semiconductor package of FIG. 2 from a viewpoint taken along line I-I' of FIG. 2.

Referring to FIGS. 1, 2 and 3A, in the semiconductor package 2003, the package substrate 2100 may be a PCB. The package substrate 2100 may include a package substrate body portion 2120, the package upper pad portions 2130 disposed on a top surface of the package substrate body portion 2120, lower pad portions 2125 disposed on or exposed through a bottom surface of the package substrate body portion 2120, and internal lines 2135, provided in the package substrate body portion 2120 to electrically connect the package upper pad portions 2130 to the lower pad portions 2125. The lower pad portions 2125 may be connected to the interconnection patterns 2005 of the main substrate 2001 of the electronic system 2000 through conductive connecting portions 2800.

Each of the semiconductor chips 2200 may include a semiconductor substrate 3010 and first and second structures 3100 and 3200 sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 penetrating the stack 3210, bit lines 3240 electrically connected to the vertical structures 3220, and cell contact plugs 3235 electrically connected to the word lines WL of the stack 3210. The second structure 3200 may further include separation structures 3230 that will be described in some additional detail hereafter.

Each of the semiconductor chips 2200 may include penetration lines 3245 electrically connected to the peripheral lines 3110 of the first structure 3100 and extending into the second structure 3200. The penetration line 3245 may be disposed outside the stack 3210 and/or may penetrate the stack 3210. Each of the semiconductor chips 2200 may further include the I/O pad portions 2210 electrically connected to the peripheral lines 3110 of the first structure 3100. Referring to FIG. 3B, in a semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 penetrating the stack 4210, and second junction structures 4240 electrically and respectively connected to the vertical structures 4220 and the word lines WL of the stack 4210. For example, the second junction structures 4240 may be electrically connected to the vertical structures 4220 through bit lines 4250 electrically connected to the vertical structures 4220, and may be electrically connected to the word lines WL through cell contact plugs 4235 electrically connected to the word lines WL. The first junction structures 4150 of the first structure 4100 and the second junction structures 4240 of the second structure 4200 may be in contact with each other and may be bonded to each other. Portions of the first and second junction structures 4150 and 4240, bonded to each other, may be formed of, for example, copper (Cu). Each of the semiconductor chips 2200 and 2200a may further include the I/O pad portions (see, e.g., 2210 of FIG. 2) electrically connected to the peripheral lines 4110 of the first structure 4100.

The semiconductor chips 2200 of FIG. 3A and the semiconductor chips 2200a of FIG. 3B may be connected to each other by the connection structures 2400—e.g., provided in the form of bonding wires. However, in some embodiments such as those illustrated in FIGS. 3A and 3B, the semiconductor chips (e.g., 2200 or 2200a) provided in each semiconductor package may be electrically connected by a connection structure including through silicon vias (TSVs).

The first structure 3100 of FIG. 3A and the first structure 4100 of FIG. 3B may correspond to a peripheral circuit structure in some embodiments described hereafter, and the second structure 3200 of FIG. 3A and the second structure 4200 of FIG. 3B may correspond to a cell array structure in some embodiments described hereafter.

Figure 4:
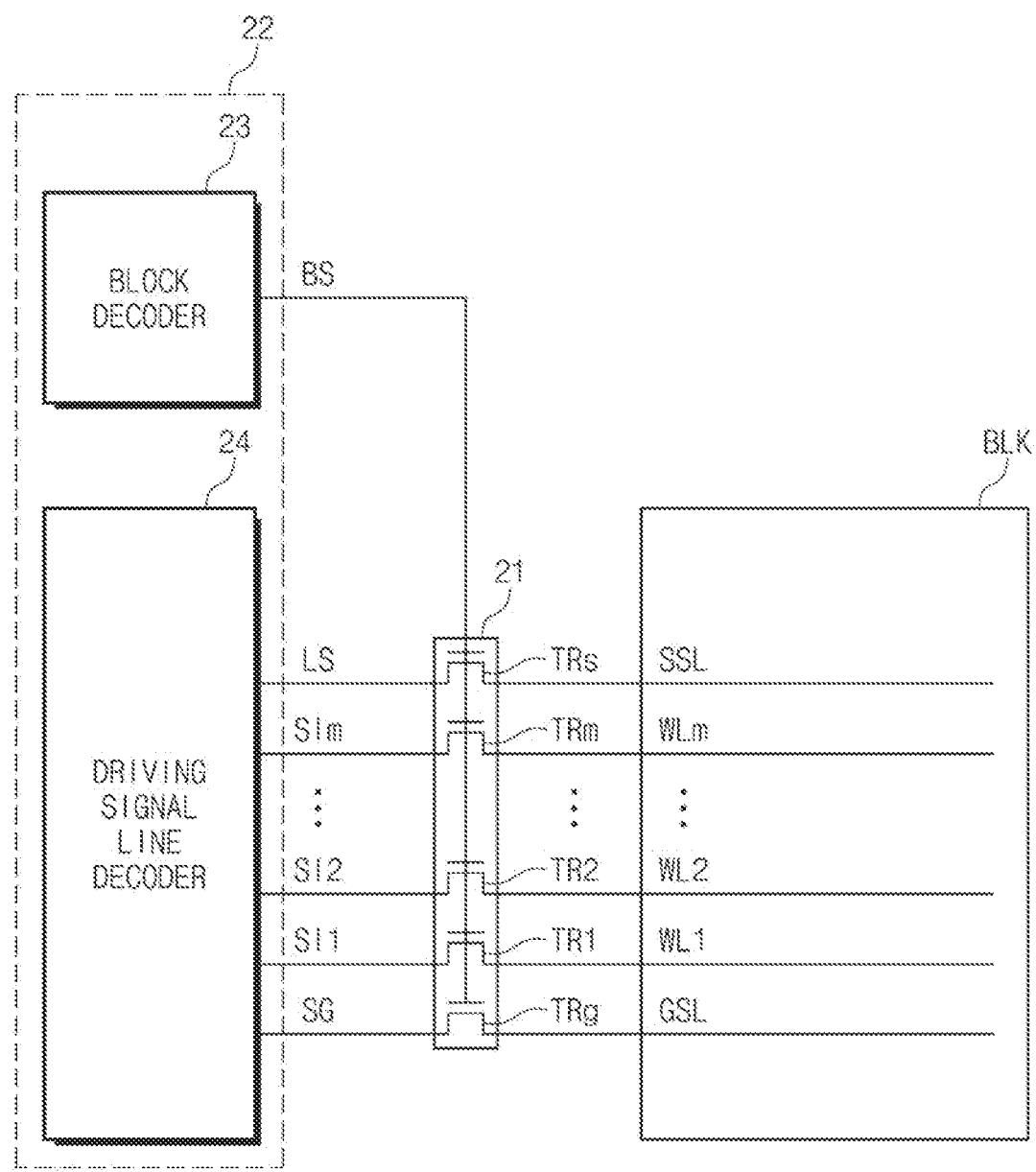
FIG. 4 is a block diagram illustrating a decoder circuit and a pass transistor circuit according to embodiments of the inventive concept.

FIG. 4 is a block diagram illustrating a decoder circuit 22 and a pass transistor circuit 21 according to embodiments of the inventive concept.

Referring to FIG. 4, a memory block BLK may correspond to one of the memory blocks described with reference to FIG. 1. The memory block BLK may be connected to a decoder circuit 22 through a pass transistor circuit 21. The decoder circuit 22 may include a block decoder 23 and a driving signal line decoder 24. The pass transistor circuit 21 may include a plurality of pass transistors TRs, TR1-TRm, and TRg.

The block decoder 23 may be connected to the pass transistor circuit 21 through a block selection signal line BS. That is, the block selection signal line BS may be connected to gates of the pass transistors TRs, TR1-TRm, and TRg. For example, if a block selection signal provided through the block selection signal line BS is activated, the pass transistors TRs, TR1-TRm, and TRg may be turned ON, and thus, the memory block BLK may be selected.

The driving signal line decoder 24 may be connected to the pass transistor circuit 21 through a string selection line driving signal line LS, word line driving signal lines SI1 to SIm, and a ground selection line driving signal line SG. That is, the string selection line driving signal line LS, the word line driving signal lines SI1 to SIm, and the ground selection line driving signal line SG may be respectively connected to sources of the pass transistors TRs, TR1-TRm, and TRg.

The pass transistor circuit 21 may be connected to the memory block BLKa through a ground selection line GSL, a plurality of word lines WL1-WLm, and a string selection line SSL. The pass transistors TR1-TRm may connect the word lines WL1-WLm to corresponding word line driving signal lines SI1 to Sim, respectively. The pass transistor TRs may connect the string selection line SSL to a corresponding string selection line driving signal line LS. The pass transistor TRg may connect the ground selection line GSL to a corresponding ground selection line driving signal line SG. For example, if the block selection signal is activated, the pass transistors TRs, TR1-TRm, and TRg may provide driving signals through the string selection line driving signal line LS, the word line driving signal lines SI1 to SIm, and the ground selection line driving signal line SG, to the string selection line SSL, the word lines WL1-WLm, and the ground selection line GSL, respectively.

Figure 5:
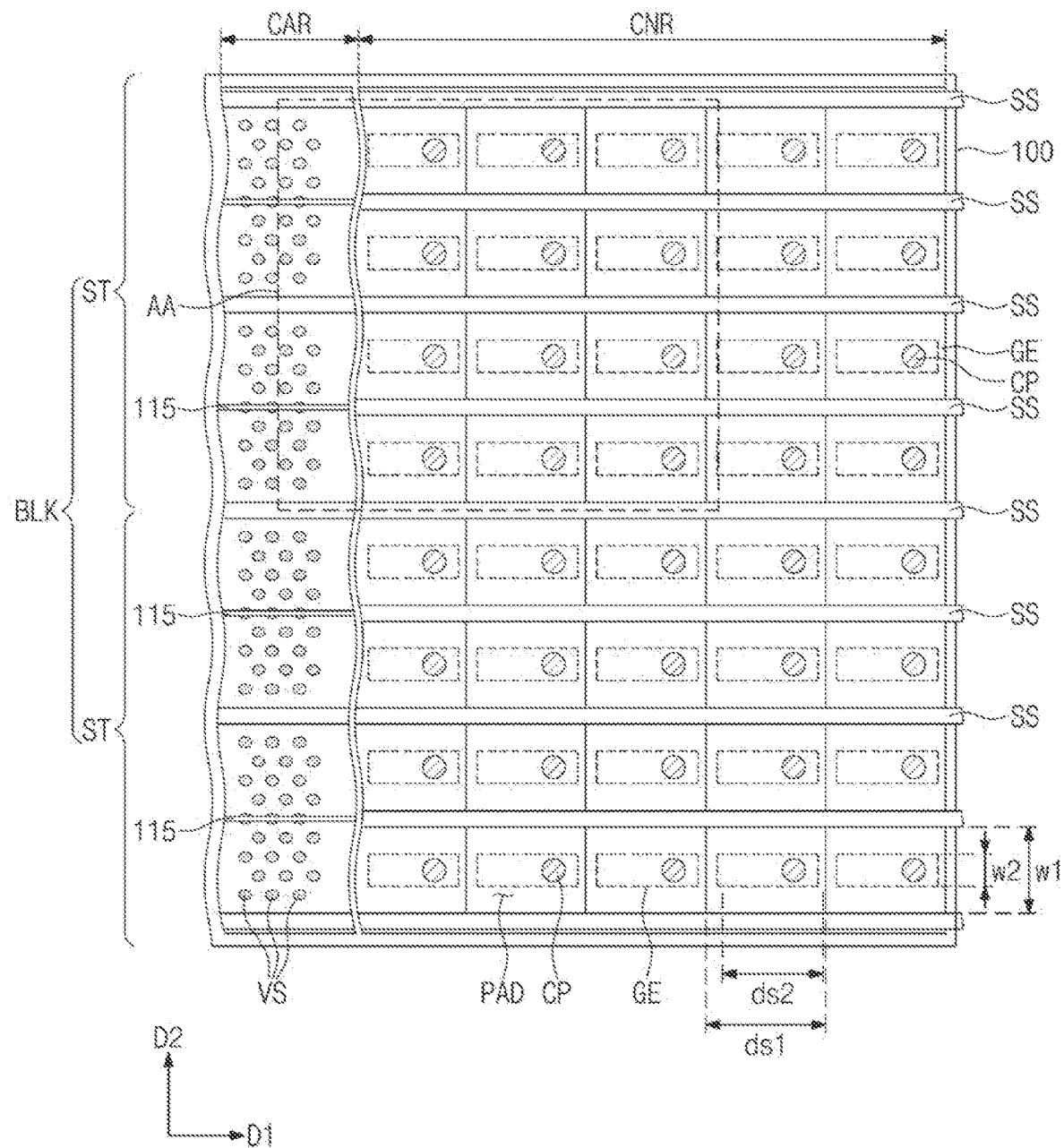
FIG. 5 is a plan (or top-down) view illustrating a semiconductor device according to embodiments of the inventive concept.

FIG. 5 is a plan view illustrating a semiconductor device according to embodiments of the inventive concept.

Referring to FIGS. 4 and 5, the memory block BLK may be provided on a substrate 100. The substrate 100 may include a cell array region CAR and a connection region CNR arranged in the first direction D1. The cell strings CSTR described with reference to FIG. 1 may be provided on the cell array region CAR of the substrate 100, and circuits and interconnection lines, which may be used to connect the cell strings CSTR to the decoder circuit 22, may be provided on the connection region CNR.

The memory block BLK may include a plurality of electrode structures ST on the substrate 100. The electrode structures ST may extend in the first direction D1 and may be spaced apart in the second direction D2. Each of the electrode structures ST may be provided between separation structures SS provided to cross the memory block BLK in the first direction D1. A portion of the separation structures SS may cross the electrode structures ST in the first direction D1 and thereby to electrically separate the word lines WL1-WLm and the ground selection lines GSL in the electrode structures ST from each other. An auxiliary separation structure 115 may be provided on the cell array region CAR and may be aligned to a portion of the separation structures SS in the first direction D1. The auxiliary separation structure 115 may be disposed between the string selection lines SSL in the electrode structures ST.

Vertical structures VS with data storage elements may be provided on the cell array region CAR of the substrate 100. Each of the vertical structures VS may be controlled by the word lines WL1-WLm in the electrode structures ST. The electrode structures ST may have pads PAD provided on the connection region CNR and respectively connected to the word lines WL1-WLm. Each of the pads PAD may be connected to the pass transistor circuit 21 through a penetration electrode CP. Hereinafter, the semiconductor device according to an embodiment of the inventive concept will be further described in some additional detail with reference to the electrode structures ST.

Figure 6:
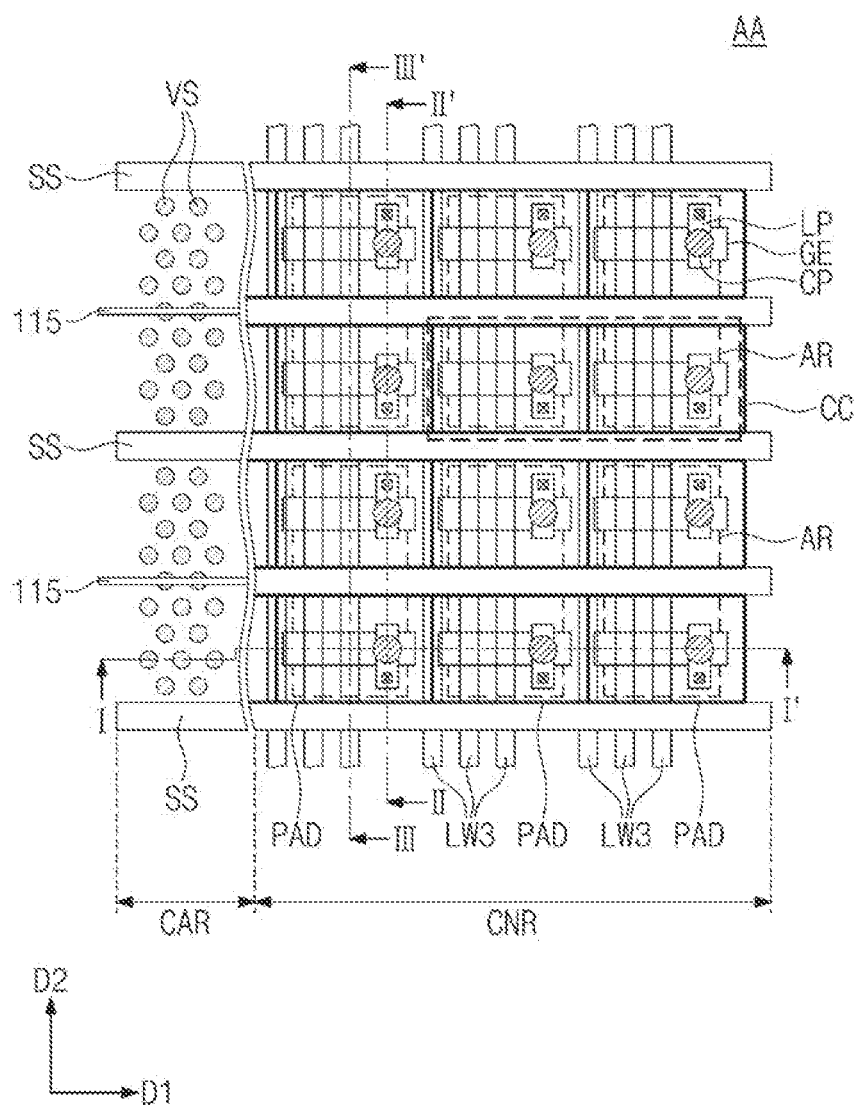
FIG. 6 is an enlarged view of region 'AA' indicated in FIG. 5.
Figure 7A:
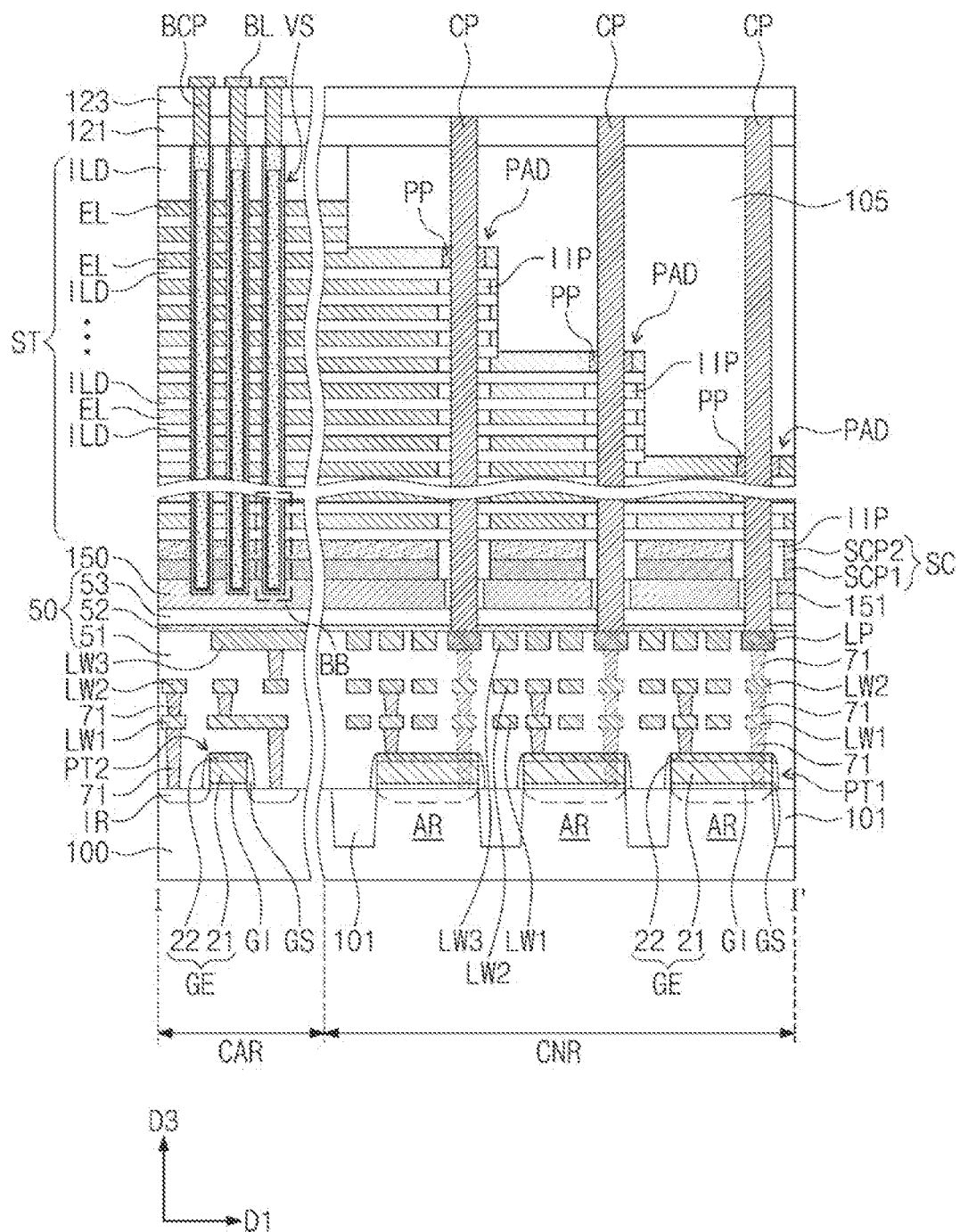
FIGS. 7A, 7B and 7C are respective sectional views taken along lines I-I', II-II', and III-III' of FIG. 6.
Figure 7B:
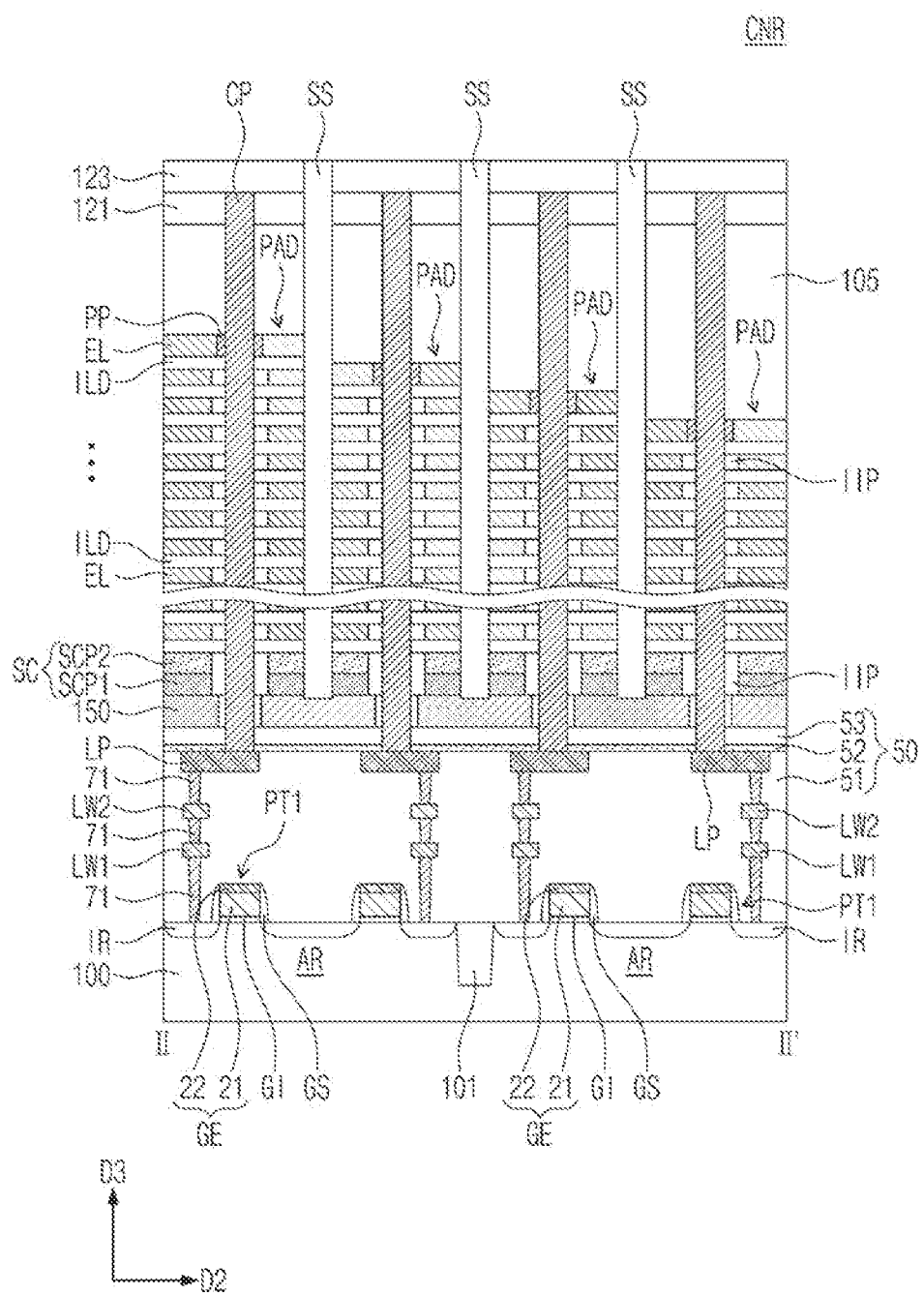
Figure 7C:
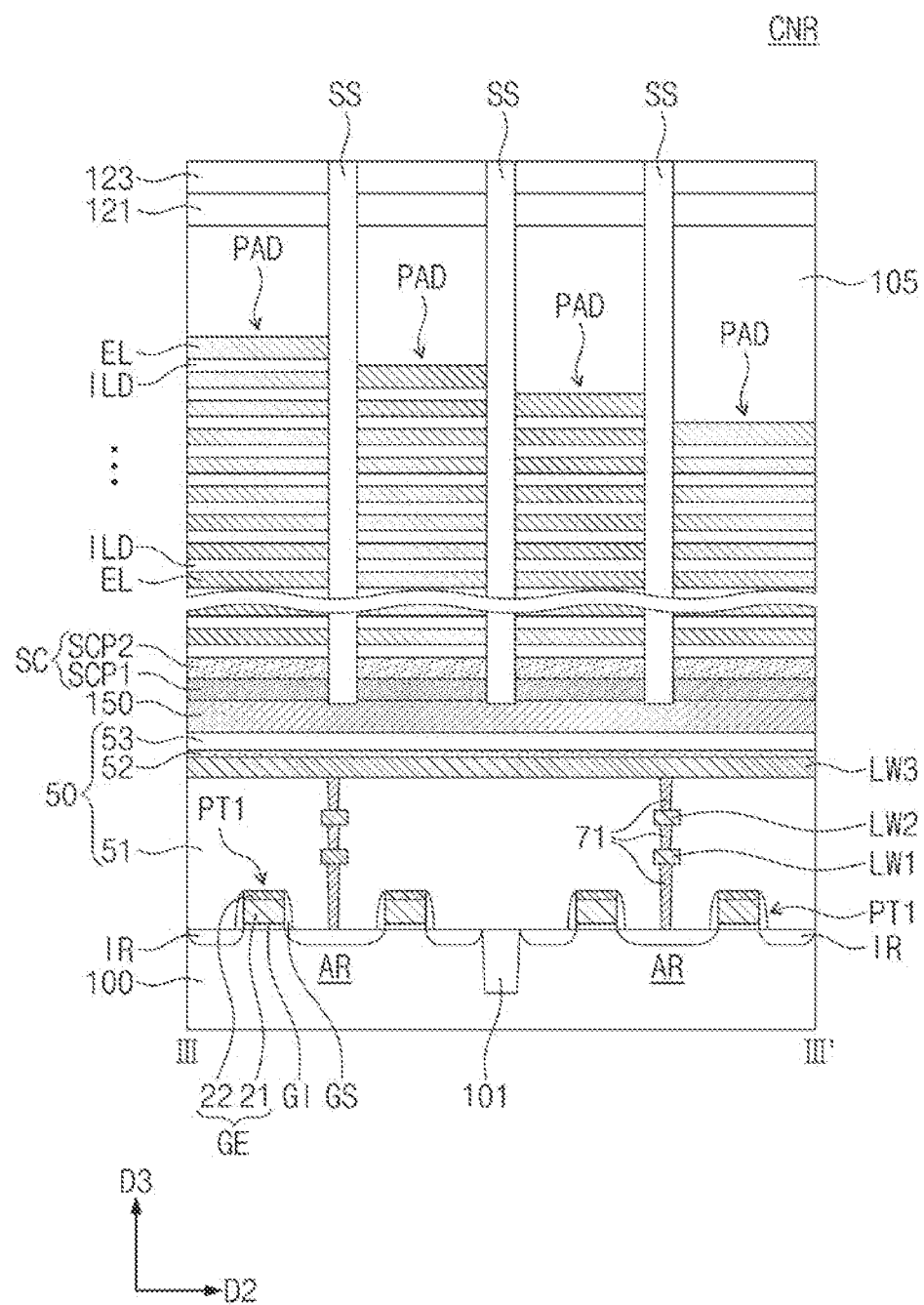
Figure 8:
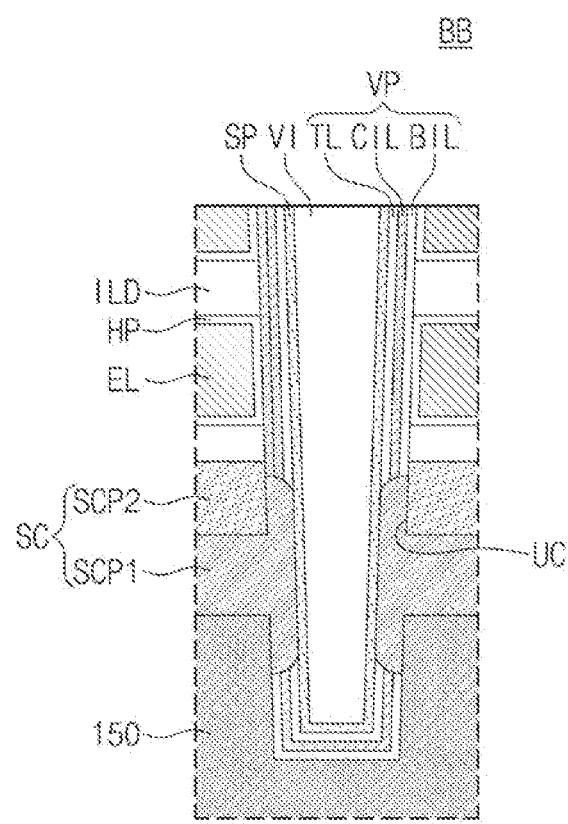
FIG. 8 is an enlarged view of region 'BB' indicated in FIG. 7A.

FIG. 6 is an enlarged view of region 'AA' indicated in FIG. 5, FIGS. 7A, 7B and 7C are respective cross-sectional views taken along lines I-I', II-II', and III-III' of FIG. 6, and FIG. 8 is an enlarged view of region 'BB' indicated in FIG. 7A.

Referring to FIGS. 6, 7A, 7B and 7C, the substrate 100 may be a silicon substrate, a silicon-germanium substrate, a germanium substrate, or a single-crystalline epitaxial layer grown on a single-crystalline silicon substrate. The substrate 100 may be a structure doped with one or more impurities of first conductivity type (e.g., P-type).

Device isolation layers 101 may be provided on the substrate 100 to define active regions AR. The device isolation layer 101 may include a trench, which is extended from a top surface of the substrate 100 toward a bottom surface, and an insulating material, which is provided in the trench. The insulating material may be, for example, silicon oxide.

Peripheral circuits may be integrated on the substrate 100. The peripheral circuits may include first peripheral transistors PT1 integrated on the connection region CNR, and second peripheral transistors PT2 integrated on the cell array region CAR. The first peripheral transistors PT1 may be the pass transistors TRs, TR1-TRm, and TRg described with reference to FIG. 4 and may constitute the pass transistor circuit 21. The second peripheral transistors PT2 may constitute the decoder circuit 22 described with reference to FIG. 4. Each of the first and second peripheral transistors PT1 and PT2 may include a gate insulating layer GI, a gate electrode GE, and a gate spacer GS. In addition, each of the first and second peripheral transistors PT1 and PT2 may include a source region, a drain region, and a channel region, which is used as a current conduction path between the source and drain regions depending on an electric signal applied to the gate electrode GE.

Impurity regions IR may be provided in an upper portion of the active regions AR. The impurity regions IR may be doped to have a second conductivity type (e.g., N-type). The impurity regions IR may include the source and drain regions of the first and second peripheral transistors PT1 and PT2. The impurity regions IR may be spaced apart from each other with the gate electrode GE interposed therebetween.

The gate electrodes GE of the first peripheral transistors PT1 may be disposed on the active regions AR of the connection region CNR. The gate electrodes GE of the first peripheral transistors PT1 may be provided below the pads PAD, respectively. That is, each pad PAD may be vertically overlapped with a corresponding one of the gate electrodes GE. The gate electrodes GE may be arranged in the first and second directions D1 and D2 with the same pitch as the pads PAD. That is, a horizontal distance between centers of two pads PAD adjacent in the first direction D1 may be equal to a horizontal distance between centers of two gate electrodes GE disposed there-below. A horizontal distance between centers of two pads PAD adjacent to each other in the second direction D2, may be equal to a horizontal distance between centers of two gate electrodes GE disposed there-below. The gate electrodes GE of the first peripheral transistors PT1 may extend in the first direction D1. That is, for the gate electrodes GE of the first peripheral transistors PT1, a length in the first direction D1 may be greater than a length in the second direction D2. Lengths of the gate electrodes GE in the first direction D1 may be shorter than lengths of the pads PAD in the first direction D1. Lengths of the gate electrodes GE in the second direction D2 may be shorter than lengths of the pads PAD in the second direction D2.

The gate electrodes GE of the second peripheral transistors PT2 may be provided on the cell array region CAR. The lengths of the gate electrodes GE of the second peripheral transistors PT2 in the first direction D1 may be shorter than those of the gate electrodes GE of the first peripheral transistors PT1.

Lower interconnection lines LW1, LW2, and LW3 may be disposed on the substrate 100. The lower interconnection lines LW1, LW2, and LW3 may be connected to the peripheral transistors PT1 and PT2 through lower contacts 71. That is, the lower interconnection lines LW1, LW2, and LW3 may be electrically connected to one of the gate electrodes GE, the source regions, and the drain regions of the peripheral transistors PT1 and PT2. The lower interconnection lines LW1, LW2, and LW3 may include first lower interconnection lines LW1, second lower interconnection lines LW2, and third lower interconnection lines LW3, which may be distinguished by their respective levels. (In this regard, the term "level" may be used denote a distance or relative vertical position—e.g., measured in the third direction—between a region, an element, a component or a feature and an arbitrarily selected horizontal plane (e.g., a plane defined in the first and second directions)). The first lower interconnection lines LW1 may be closer to the top surface of the substrate 100 than the third lower interconnection lines LW3. The second lower interconnection lines LW2 may be disposed between the first lower interconnection lines LW1 and the third lower interconnection lines LW3.

Landing pads LP connected to the first peripheral transistors PT1 may be provided on the connection region CNR. The landing pads LP may be disposed at the same level as the third lower interconnection lines LW3. For example, top and bottom surfaces of the landing pads LP may be disposed at the same levels as top and bottom surfaces of the third lower interconnection lines LW3.

The landing pads LP may be vertically overlapped by the first lower interconnection line LW1 and the second lower interconnection line LW2. The landing pads LP may be connected to the impurity regions IR on the active region AR through the first lower interconnection lines LW1, the second lower interconnection lines LW2, and the lower contacts 71. The impurity regions IR electrically connected to the landing pads, LP may be the drain regions of the first peripheral transistors PT1. The landing pads LP may be formed of at least one metal, such as for example, aluminum, copper, and tungsten.

In some embodiments, the memory device may have a chip-to-chip (C2C) structure. In this case, the landing pads LP may be composed of bonding pads. For example, the landing pad LP may be a pad portion 1272b, which is one of lower bonding metals 1271b and 1272b to be described with reference to FIG. 20. The landing pads LP may be formed of or include, for example, copper and may be directly bonded to a bonding metal, which is formed on a surface of a chip including a memory cell array.

A lower interlayer insulating layer 50 may be provided on the entire top surface of the substrate 100. The lower interlayer insulating layer 50 may cover peripheral transistors PTR, the lower contacts 71, the lower interconnection lines LW1, LW2, and LW3, and the landing pads LP. The lower interlayer insulating layer 50 may include sequentially stacked first lower layer 51, second lower layer 52, and third lower layer 53. The second lower layer 52 may have a thickness less than that of the first lower layer 51 and the third lower layer 53. Each of the first lower layer 51, the second lower layer 52, and the third lower layer 53 may include, for example, a silicon oxide layer, a silicon nitride layer, a silicon oxynitride layer, and/or a low-k dielectric layer. The second lower layer 52 may be formed of or include at least one of materials having an etch selectivity with respect to the first lower layer 51 and the third lower layer 53. In some embodiments, the second lower layer 52 may serve as an etch stop layer.

A cell array structure may be provided on the lower interlayer insulating layer 50. The cell array structure may include a horizontal layer 150, a source structure SC, the electrode structure ST, and the vertical structures VS. The cell array structure may include the cell strings CSTR described with reference to FIG. 1.

The horizontal layer 150 may be disposed on a top surface of the lower interlayer insulating layer 50. The horizontal layer 150 may be formed of or include at least one of semiconductor material, such as for example, silicon (Si), germanium (Ge), silicon germanium (SiGe), gallium arsenic (GaAs), indium gallium arsenic (InGaAs), and aluminum gallium arsenic (AlGaAs). The horizontal layer 150 may be formed of or may include a doped semiconductor material of a first conductivity type and/or an undoped intrinsic semiconductor material. The first conductivity type may be, for example, N-type. The horizontal layer 150 may have one of single-crystalline, poly-crystalline, and amorphous structures. The horizontal layer 150 may have a top surface extending in the first and second directions D1 and D2.

The source structure SC may be disposed between the electrode structure ST and the horizontal layer 150. A source structure CS may extend parallel to the electrode structure ST or in the first and second directions D1 and D2. The source structure SC may include a first horizontal pattern SCP1 and a second horizontal pattern SCP2 on the first horizontal pattern SCP1. The first horizontal pattern SCP1 and the second horizontal pattern SCP2 may be sequentially stacked on the horizontal layer 150. In some embodiments, the first horizontal pattern SCP1 may be directly disposed on the top surface of the horizontal layer 150. Each of the first and second horizontal patterns SCP1 and SCP2 may be formed of or include a doped semiconductor material of the first conductivity type. For example, the first and second horizontal patterns SCP1 and SCP2 may be formed of or include a semiconductor material doped with one or more N-type dopants (e.g., phosphorus (P) and/or arsenic (As)). In some embodiments, the first horizontal pattern SCP1 may have an N-type dopant concentration higher than that of the second horizontal pattern SCP2.

The electrode structure ST may be disposed on the horizontal layer 150. The electrode structure ST may be disposed between the separation structures SS, and may extend in the first direction D1 and in parallel. The electrode structure ST may be spaced apart from the horizontal layer 150 with the source structure SC interposed therebetween. The electrode structure ST may extend from the cell array region CAR to the connection region CNR in the first direction D1.

The electrode structure ST may include electrodes EL and insulating patterns ILD, alternately and vertically stacked in the third direction D3 on the top surface of the horizontal layer 150. The electrodes EL and the insulating patterns ILD may be disposed between a pair of the separation structures SS adjacent to each other in the second direction D2. The electrodes EL may have substantially the same thickness, and the insulating patterns ILD may have at least two different thicknesses in accordance with desired performance characteristics of the semiconductor device. For example, one of the insulating patterns ILD on a top surface of a lowermost one of the electrodes EL may be thicker than the insulating patterns ILD between the others of the electrodes EL. One of the insulating patterns ILD on a top surface of an uppermost electrode EL may be thicker than the others of the insulating patterns ILD. Each of the electrodes EL may be formed of at least one of, for example one or more doped semiconductor materials (e.g., doped silicon), one or more metallic materials (e.g., tungsten, copper, or aluminum), one or more conductive metal nitrides (e.g., titanium nitride or tantalum nitride), and/or one or more transition metals (e.g., titanium or tantalum). Each of the insulating patterns ILD may be formed of, or include, silicon oxide.

The electrode structure ST may have a staircase structure on the connection region CNR. The staircase structure of the electrode structure ST may have a decreasing height with increasing distance from the cell array region CAR. The staircase structure of the electrode structure ST may define the pads PAD on the connection region CNR. The pads PAD may be portions of the electrodes EL. A portion of the electrode EL defining the pad PAD may not be veiled by another electrode EL, that is, directly disposed on same. Each of the pads PAD may connect a corresponding one of the electrodes EL the peripheral circuit structure. In some embodiments, the pad PAD may be thicker than other portions of the electrode EL between the insulating patterns ILD. For example, each of the pads PAD may protrude in a direction away from the top surface of the substrate 100 and may cover a portion of a lower side surface of the insulating pattern ILD.

The vertical structures VS may be provided on the cell array region CAR to penetrate the electrode structure ST. The vertical structures VS may be arranged in the first and second directions D1 and D2. The vertical structures VS may be respectively provided in channel holes that penetrate the electrode structure ST. The vertical structures VS may have top surfaces disposed at the same level as the top surface of the uppermost one of the insulating patterns ILD of the electrode structure ST. The vertical structures VS may have bottom surfaces disposed at a level lower than the top surface of the horizontal layer 150. A diameter of each of the vertical structures VS may gradually decrease as a vertical position from the substrate 100 is lowered.

Referring to FIG. 8, each of the vertical structures VS may include a vertical semiconductor pattern VP, a data storage pattern SP, and a gapfill insulating pattern VI. The vertical semiconductor pattern VP, the data storage pattern SP, and the gapfill insulating pattern VI may be sequentially provided on an inner side surface of the channel hole.

The vertical semiconductor pattern VP may be interposed between the data storage pattern SP and the gapfill insulating pattern VI. The vertical semiconductor pattern VP may be shaped like a pipe with an open top end. The vertical semiconductor pattern VP may be spaced apart from the electrodes EL with the data storage pattern SP interposed therebetween. The vertical semiconductor pattern VP may be formed of, or may include, at least one semiconductor material, such as for example, Si and Ge. Furthermore, the vertical semiconductor pattern VP may be formed of or include a doped semiconductor material or an undoped intrinsic semiconductor material. The vertical semiconductor pattern VP may be used as channel regions of memory cell transistors constituting a cell string of a NAND flash memory device.

The vertical semiconductor pattern VP may be connected to the source structure SC. That is, the first horizontal pattern SCP1 of the source structure SC may penetrate the data storage pattern SP and to be in contact with a side surface of the vertical semiconductor pattern VP. The first horizontal pattern SCP1 may be formed to fill an undercut region UC, which is formed to partially exposed a side surface of the second horizontal pattern SCP2. In some embodiments, the first horizontal pattern SCP1 may penetrate the vertical semiconductor pattern VP and to be in contact with the gapfill insulating pattern VI.

The gapfill insulating pattern VI may cover an inner surface of the vertical semiconductor pattern VP. The gapfill insulating pattern VI may be spaced apart from the data storage pattern SP with the vertical semiconductor pattern VP interposed therebetween. The gapfill insulating pattern VI may have a circular pillar shape.

The data storage pattern SP may enclose the vertical semiconductor pattern VP. The data storage pattern SP may cover an outer surface of the vertical semiconductor pattern VP. The data storage pattern SP may be shaped like a pipe with an open top end. The data storage pattern SP may be a data storing layer of the NAND flash memory device and may include a tunnel insulating layer TL, a charge storing layer CL, and a blocking insulating layer BIL.

The charge storing layer CL may be a trap insulating layer, a floating gate electrode, or an insulating layer with conductive nanodots. The charge storing layer CL may include at least one of a silicon nitride layer, a silicon oxynitride layer, a silicon-rich nitride layer, a nanocrystalline silicon layer, or a laminated trap layer. The tunnel insulating layer TL may be formed of or include a material whose band gap is greater than the charge storing layer CL. The tunnel insulating layer TL may include a high-k dielectric layer (e.g., an aluminum oxide layer and a hafnium oxide layer) or a silicon oxide layer. The blocking insulating layer BIL may include a silicon oxide layer and/or an aluminum oxide layer.

An electrode barrier layer HP may be provided between the electrodes EL and the insulating patterns ILD. The electrode barrier layer HP may extend into a region between the electrodes EL and the vertical structures VS. The electrode barrier layer HP may be formed of, or may include, at least one of metal nitride, such as for example, titanium nitride, tantalum nitride, and tungsten nitride. The electrode barrier layer HP may further include at least one transition metal layer, such as for example, titanium and tantalum, in addition to the at least one metal nitride material. Alternately, the electrode barrier layer HP may include at least one high-k metal oxide layer, such as for example, an aluminum oxide layer and a hafnium oxide layer.

Referring again to FIGS. 6, 7A, 7B and 7C, a planarization insulating layer 105 may be provided on the electrode structure ST. On the connection region CNR, the planarization insulating layer 105 may cover the pads PAD of the electrode structure ST. A top surface of the planarization insulating layer 105 may be disposed at the same level as the top surface of the uppermost one of the insulating patterns ILD of the electrode structure ST. The planarization insulating layer 105 may include a single insulating layer or a plurality of stacked insulating layers. For example, the planarization insulating layer 105 may include a silicon oxide layer and/or a low-k dielectric layer.

A first interlayer insulating layer 121 and a second interlayer insulating layer 123 may be provided on the planarization insulating layer 105. The first and second interlayer insulating layers 121 and 123 may be formed of or include, for example, silicon oxide. On the cell array region CAR, the first interlayer insulating layer 121 may cover top surfaces of the vertical structures VS. On the connection region CNR, the second interlayer insulating layer 123 may cover top surfaces of the penetration electrodes CP.

The penetration electrodes CP may vertically extend to electrically connect the pads PAD to the landing pads LP. The penetration electrodes CP may penetrate the first interlayer insulating layer 121, the planarization insulating layer 105, the electrode structure ST, the source structure SC, and the lower interlayer insulating layer 50. The penetration electrodes CP may have protruding portions PP which protrude in a horizontal direction. The protruding portion PP may have a side surface contacting the pad PAD. The penetration electrode CP may be electrically connected to the electrode EL, which is disposed at the same level as the protruding portion PP.

The penetration electrodes CP may be electrically isolated from the electrodes EL and the horizontal layer 150 by an inner insulating pattern IIP and a lower insulating pattern 151. That is, the inner insulating patterns IIP may be respectively provided between the penetration electrodes CP and the electrodes EL. The inner insulating pattern IIP may electrically isolate the electrodes EL disposed below the pad PAD from the penetration electrode CP. The lower insulating patterns 151 may be provided between the penetration electrodes CP and the horizontal layer 150. The lower insulating patterns 151 may electrically isolate the horizontal layer 150 from the penetration electrodes CP. Accordingly, each of the penetration electrodes CP may be electrically connected to a corresponding one of the vertically-stacked electrodes EL disposed at the same level as a corresponding one of the pads PAD. The inner insulating pattern IIP and the lower insulating pattern 151 may be formed of, or may include at least one material, such as for example, silicon oxide, silicon oxynitride, and silicon nitride.

The penetration electrodes CP may be connected to top surfaces of the landing pads LP. Each of the landing pad LP may be connected to a corresponding one of the first peripheral transistors PT1 through a corresponding one of the lower contacts 71. That is, the vertically-stacked electrodes EL may be one-for-one connected to the first peripheral transistors PT1 through the penetration electrodes CP. The vertically-stacked electrodes EL may be independently controlled by the first peripheral transistors PT1.

Referring to FIGS. 6, 7B, and 7C, a pair of the first peripheral transistors PT1 adjacent to each other in the second direction D2 may share the impurity region IR. Thus, the impurity region IR between the adjacent pair of the first peripheral transistors PT1 may serve as a common source region. The landing pads LP may extend in the second direction D2, as shown in FIG. 7B. The landing pads LP may be electrically connected to the drain regions of the first peripheral transistors PT1 through the first lower interconnection line LW1, the second lower interconnection line LW2, and the lower contacts 71 disposed there-below. As shown in FIG. 7C, the third lower interconnection line LW3 may be electrically connected to the common source region of the first peripheral transistors PT1 through the first lower interconnection line LW1, the second lower interconnection line LW2, and the lower contacts 71 disposed there-below. The third lower interconnection line LW3, which is electrically connected to the common source region of the first peripheral transistors PT1 and may extend in the second direction D2 to vertically overlap the gate electrodes GE.

Referring to FIGS. 6 and 7A, the bit lines BL may be connected to the vertical structures VS through bit line contacts BCP. The bit lines BL may be provided on a top surface of the second interlayer insulating layer 123. The bit lines BL may extend in the second direction D2 in parallel. The bit line contacts BCP may penetrate the second interlayer insulating layer 123 to connect the vertical channel structures VS. Each of the bit lines BL may be electrically connected to conductive pads respectively provided in upper portions of the vertical channel structures VS through the bit line contact BCP.

Figure 9:
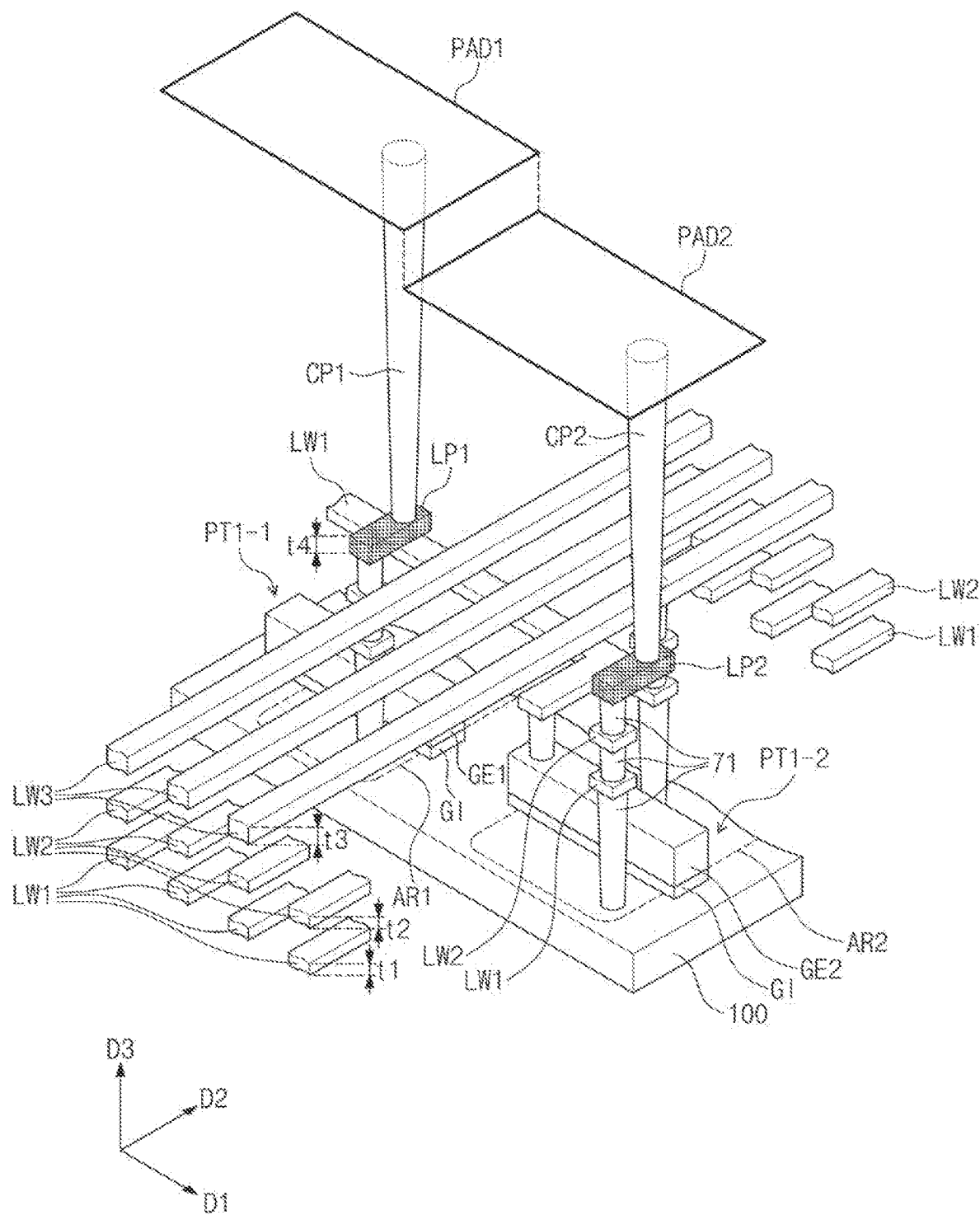
FIG. 9 is a perspective view further illustrating region 'CC' indicted in FIG. 6.

FIG. 9 is a perspective view further illustrating region 'CC' indicated in FIG. 6, and more particularly certain elements disposed in the connection region CNR.

Referring to FIGS. 6 and 9, the first peripheral transistors PT1 may include a first transistor PT1-1 including a first gate electrode GE1 and a second transistor PT1-2 including a second gate electrode GE2. The first transistor PT1-1 and the second transistor PT1-2 may be respectively formed below first and second pads PAD1 and PAD2 that are adjacent to each other.

First and second landing pads LP1 and LP2 may be provided between the first and second pads PAD1 and PAD2 and the substrate 100. The first and second landing pads LP1 and LP2 may be respectively connected to first and second active regions AR1 and AR2 through the lower contacts 71. For example, the first and second landing pads LP1 and LP2 may be electrically connected to the drain regions of the first and second transistors PT1-1 and PT1-2. The first landing pad LP1 may be connected to the first pad PAD1 through the first penetration electrode CP1. The second landing pad LP2 may be connected to the second pad PAD2 through the second penetration electrode CP2. The first and second landing pads LP1 and LP2 may be disposed at the same level. In some embodiments, lengths of the first and second penetration electrodes CP1 and CP2 may vary depending on vertical positions of the first and second pads PAD1 and PAD2. For example, the first pad PAD1 may be disposed at a level higher than the second pad PAD2, and in this case, the length of the first penetration electrode CP1 may be longer than that of the second penetration electrode CP2.

The first to third lower interconnection lines LW1, LW2, and LW3 may be provided between the first and second landing pads LP1 and LP2. Each of the first and second lower interconnection lines LW1 and LW2 may be a line-shape pattern, which is extended in a specific direction, or an island-shaped pattern, which is interposed between a vertically-overlapped pair of the lower contacts 71. One of the first lower interconnection lines LW1 may be connected to one of the first and second gate electrodes GE1 and GE2 through the lower contact 71. The first lower interconnection line LW1, which is connected to the second gate electrode GE2, may have a portion extending in the first direction D1.

The third lower interconnection lines LW3 may be provided between a side surface of the first landing pad LP1 and a side surface of the second landing pad LP2. In some embodiments, three (3) third lower interconnection lines LW3 may be disposed between the first landing pad LP1 and the second landing pad LP2. The third lower interconnection lines LW3 may cross a region between the first and second landing pads LP1 and LP2 in the second direction D2. Lengths of the third lower interconnection lines LW3 in the second direction D2 may be greater than that of the landing pads LP. The third lower interconnection lines LW3 may have a line shape. The third lower interconnection lines LW3 may have a thickness t3, and the first and second landing pads LP1 and LP2 may have a thickness t4 equal to the thickness t3. The third lower interconnection lines LW3 and the first and second landing pads LP1 and LP2 may be formed through the same process and may be formed of or include the same material. The first lower interconnection line LW1 and the second lower interconnection line LW2 may have a thickness t1 and a thickness t2, respectively less than the thickness t3 of the third lower interconnection lines LW3. At least one of the third lower interconnection lines LW3 may include a portion that vertically overlaps the second gate electrode GE2.

Figure 10:
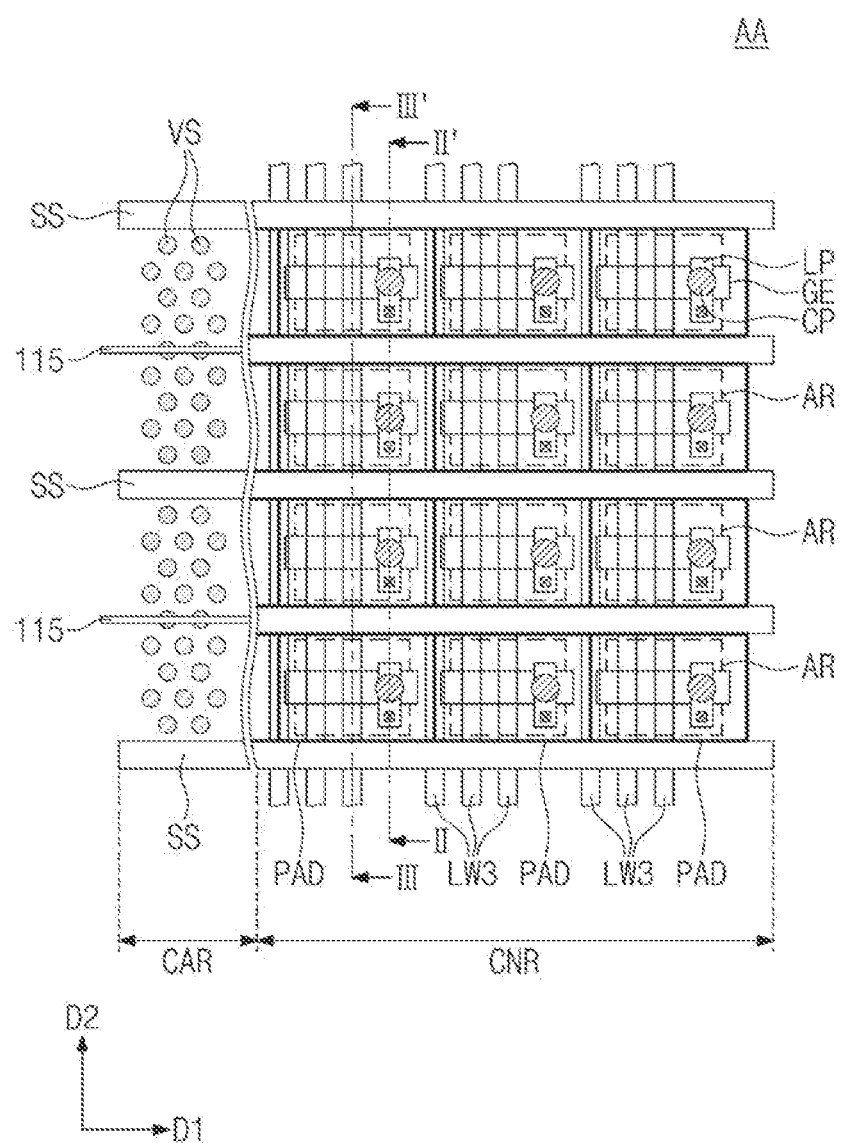
FIG. 10 is a plan view illustrating the region 'AA' of FIG. 5, and FIGS. 11A and 11B are respective cross-sectional views taken along lines II-II' and III-III' of FIG. 10.
Figure 11A:
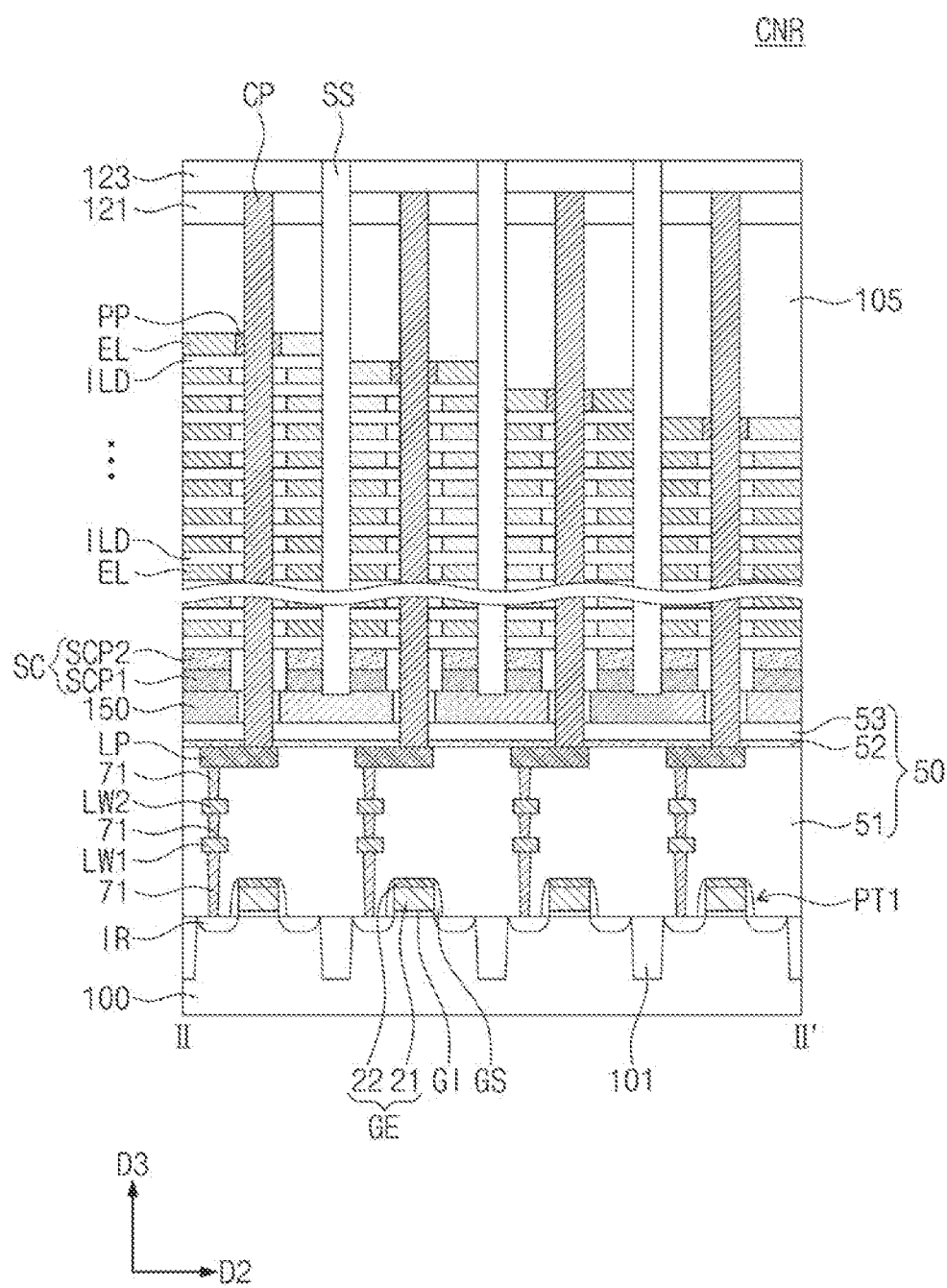
Figure 11B:
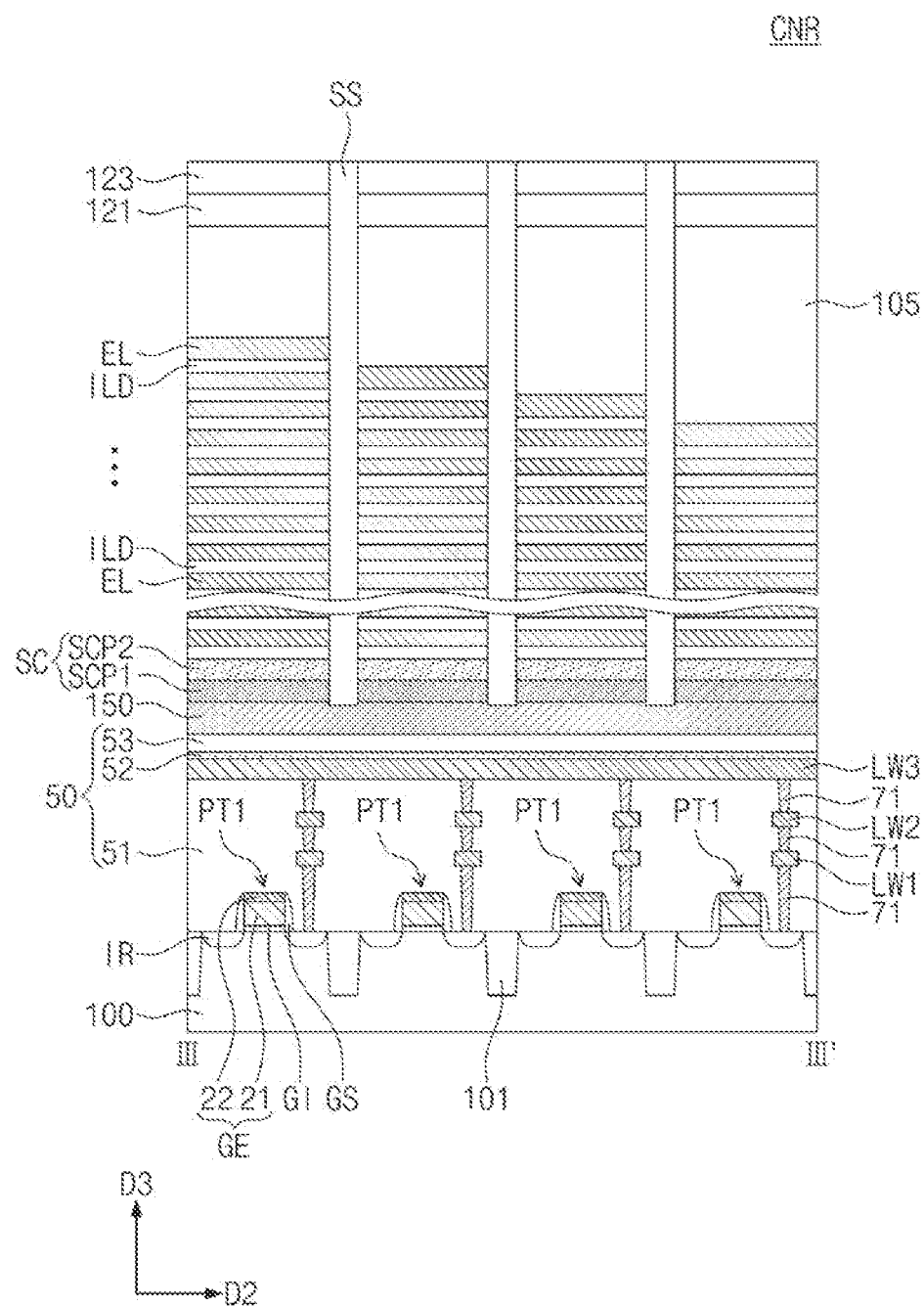

FIG. 10 is an enlarged view of region 'AA' indicated in FIG. 5, and FIGS. 11A and 11B are respective cross-sectional views taken along lines II-II' and III-III' of FIG. 10.

Referring to FIGS. 10, 11A and 11B, the first peripheral transistors PT1 may be provided on the active regions AR, respectively. Each of the active regions AR may have a pair of source and drain regions. A pair of the first peripheral transistors PT1 adjacent to each other in the second direction D2 may be spaced apart by the device isolation layer 101. For example, the first peripheral transistors PT1 adjacent in the second direction D2 may not share the source region. At least one of the third lower interconnection lines LW3 may be connected in common to the source regions of the first peripheral transistors PT1 through the lower contacts 71.

FIGS. 12A to 19A are cross-sectional views taken along the line I-I' of FIG. 6 and illustrate a method of fabricating a semiconductor device according to embodiments of the inventive concept, and FIGS. 12B to 19B are cross-sectional views taken along the line II-II' of FIG. 6 and illustrate a method of fabricating a semiconductor device according to embodiments of the inventive concept.

Figure 12A:
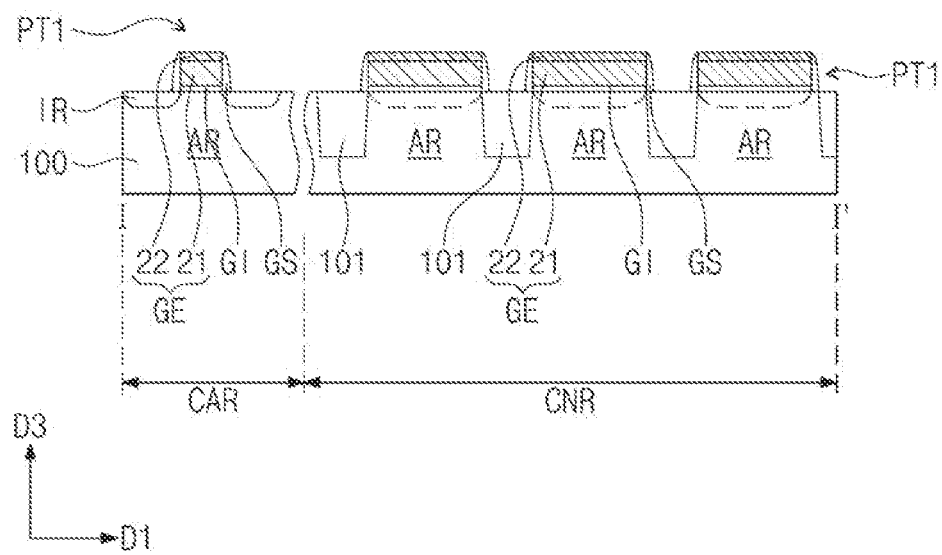
FIGS. 12A, 13A, 14A, 15A, 16A, 17A, 18A and 19A (hereafter collectively, "FIGS. 12A to 19A") are respective cross-sectional views taken along line I-I' of FIG. 6 and illustrate methods of fabricating a semiconductor device according to embodiments of the inventive concept.
Figure 12B:
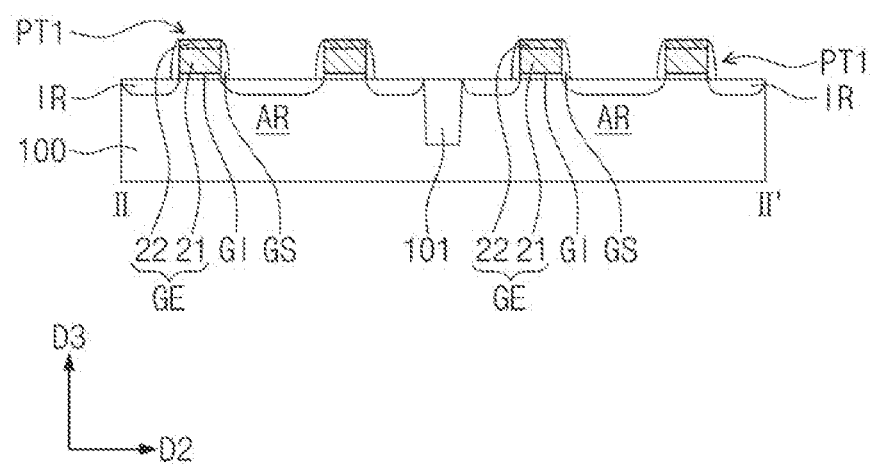
FIGS. 12B, 13B, 14B, 15B, 16B, 17B, 18B and 19B (hereafter collectively, "FIGS. 12B to 19B") are respective cross-sectional views taken along the line II-II' of FIG. 6 and illustrate methods of fabricating a semiconductor device according to embodiments of the inventive concept.

Referring to FIGS. 12A and 12B, device isolation layers 101 may be formed on a substrate 100. The device isolation layers 101 may be formed by forming a trench in an upper portion of the substrate 100 and filling the trench with an insulating material. First peripheral transistors PT1 and a second peripheral transistor PT2 may be formed on the substrate 100. The formation of the first and second peripheral transistors PT1 and PT2 may include forming a gate insulating layer GI, a gate electrode GE, a gate spacer GS, and an impurity region IR. That is, an insulating layer and conductive layers may be formed on the substrate 100. The gate insulating layer GI and the gate electrode GE may be formed by patterning the insulating layer and the conductive layers. The gate spacers GS may be formed on side surfaces of the gate insulating layer GI and the gate electrode GE. The impurity region IR may be formed by performing an ion implantation process on upper portions of the substrate 100 exposed through the gate electrode GE and the gate spacer GS, and performing a thermal treatment process.

Figure 13A:
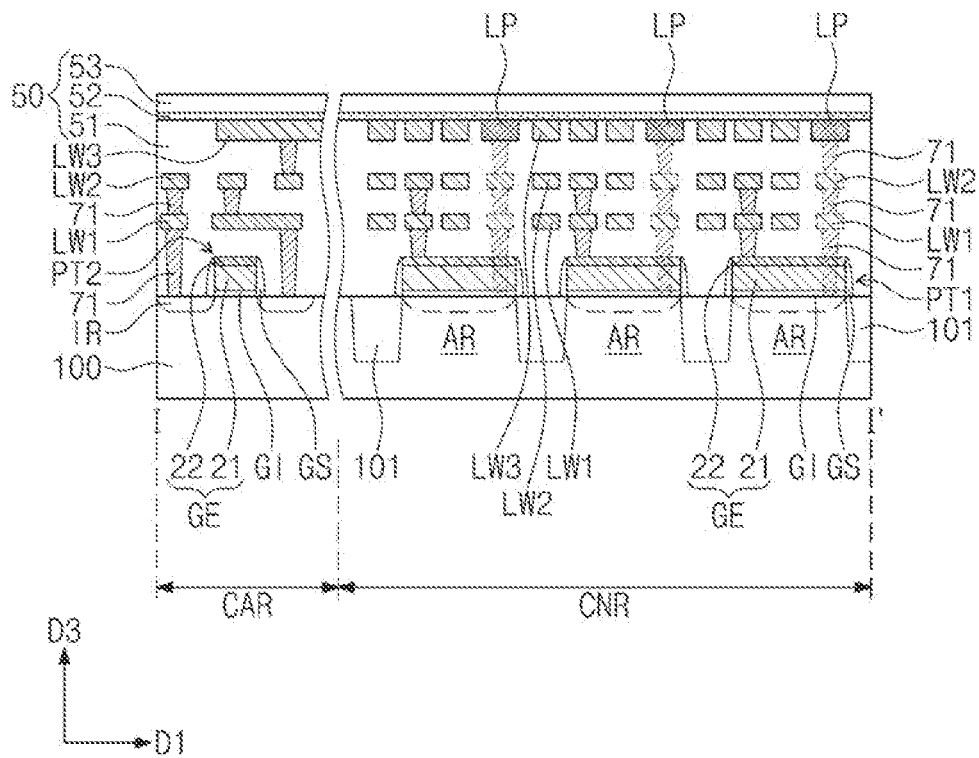
Figure 13B:
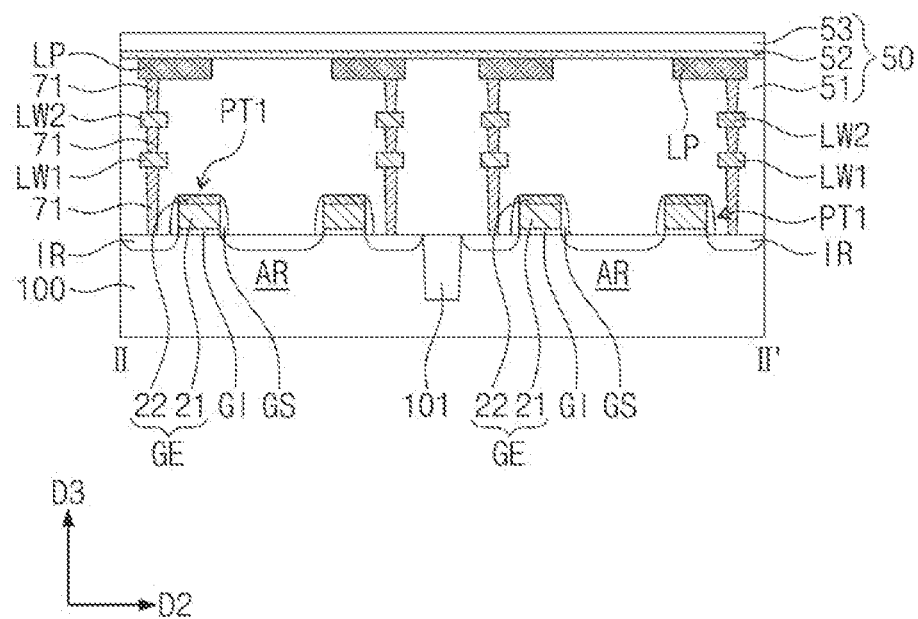

Referring to FIGS. 13A and 13B, a lower interlayer insulating layer 50 may be formed to cover the first and second peripheral transistors PT1 and PT2. Lower interconnection lines LW1, LW2, and LW3, landing pads LP, and lower contacts 71 may be formed in the lower interlayer insulating layer 50. The lower interlayer insulating layer 50 may include a first lower layer 51, a second lower layer 52, and a third lower layer 53. In some embodiments, the lower interlayer insulating layer 50 may include at least one of, for example, a silicon oxide layer, a silicon nitride layer, a silicon oxynitride layer, and a low-k dielectric layer.

Figure 14A:
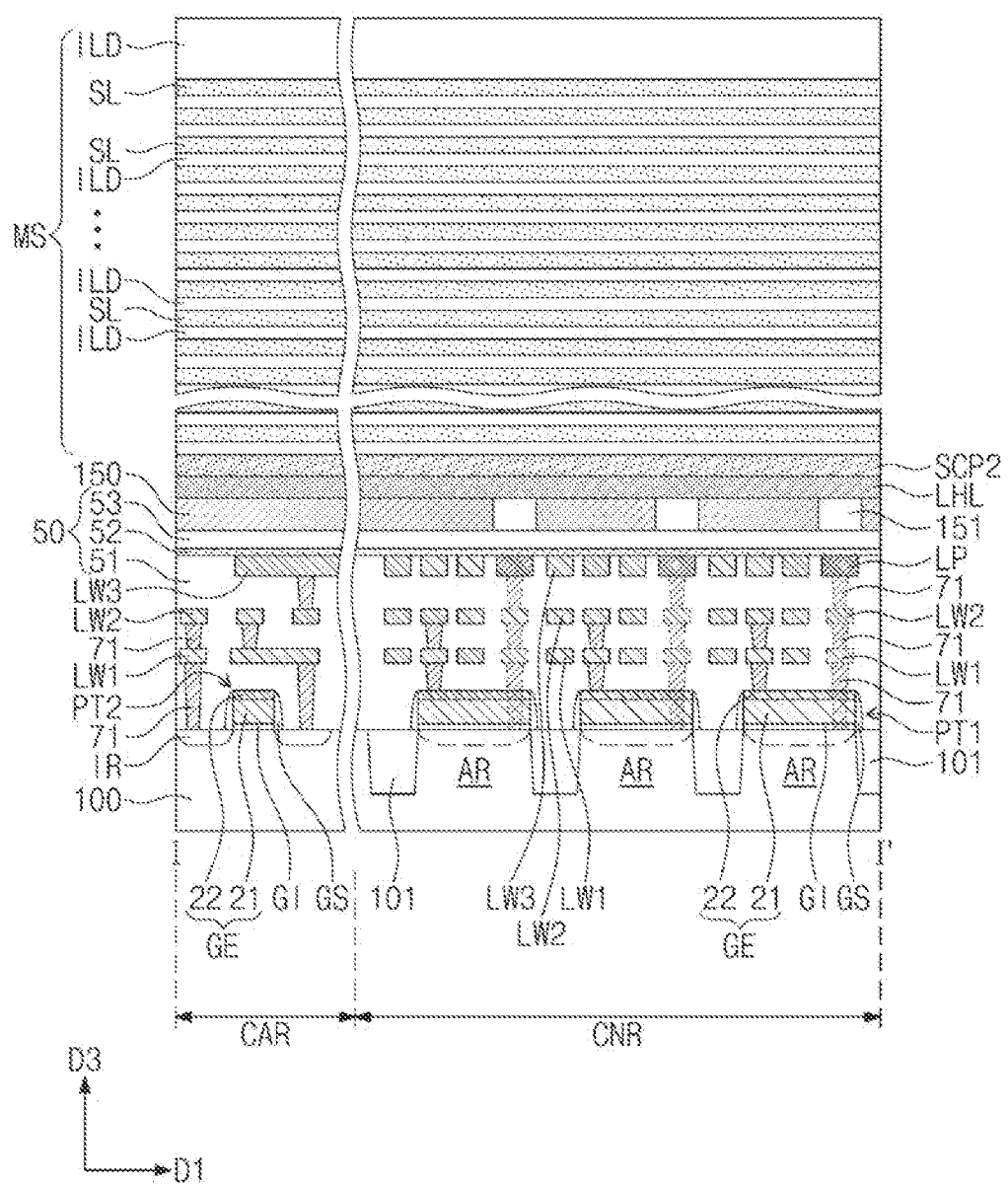
Figure 14B:
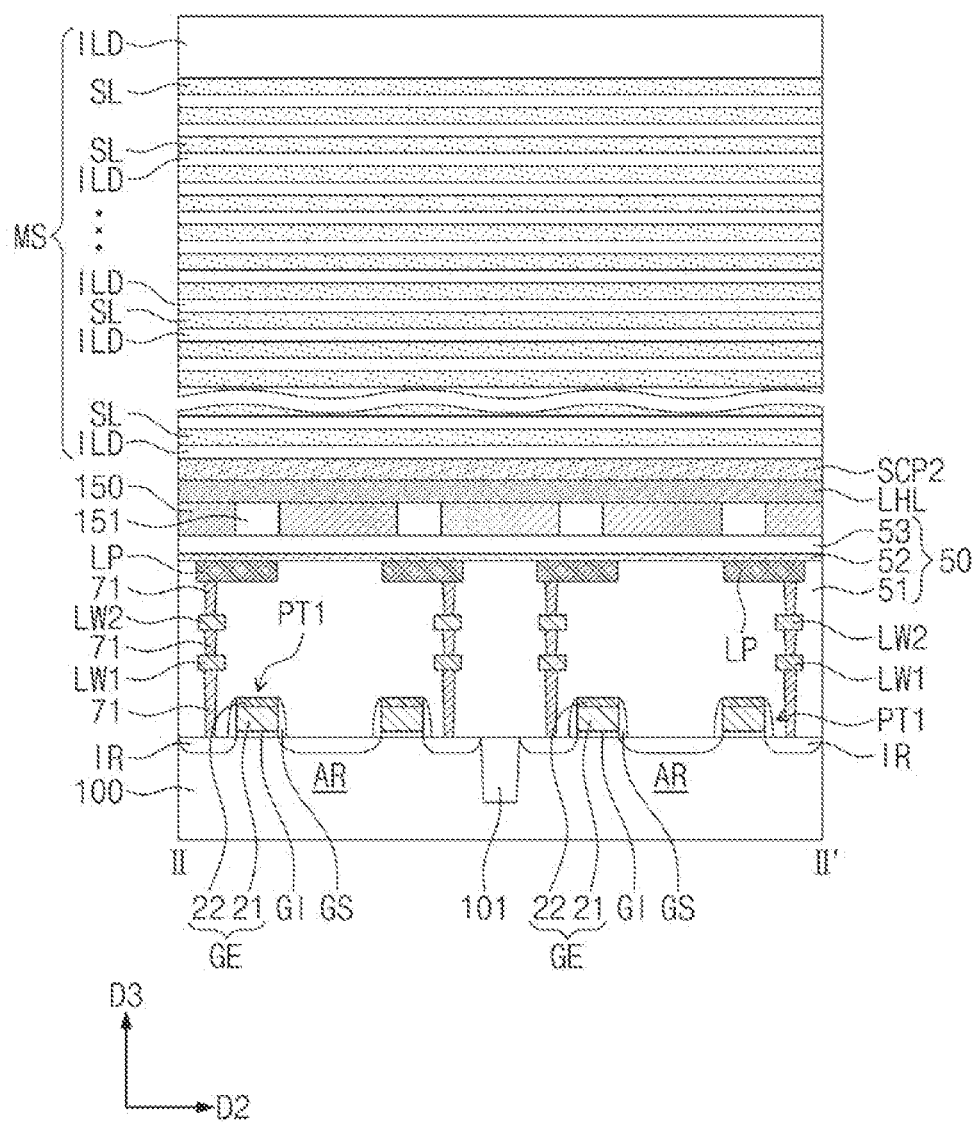

Referring to FIGS. 14A and 14B, a horizontal layer 150 may be formed on the lower interlayer insulating layer 50. The horizontal layer 150 may be formed of or include at least one semiconductor material, such as for example, Si, Ge, SiGe, GaAs, InGaAs, and AlGaAs. In some embodiments, the horizontal layer 150 may be formed of, or may include, a doped semiconductor material and/or an undoped intrinsic semiconductor material. The horizontal layer 150 may include at least one of a single-crystalline structure, a poly-crystalline structure, and an amorphous structure.

Lower insulating patterns 151 may be formed in the horizontal layer 150. The formation of the lower insulating pattern 151 may include forming a trench exposing the lower interlayer insulating layer 50 and filling the trench with an insulating material. The lower insulating patterns 151 may be vertically overlapped by the landing pads LP. A planarization process may be performed on the lower insulating pattern 151, and as a result, the lower insulating pattern 151 may have a top surface disposed at the same level as the top surface of the horizontal layer 150.

A lower sacrificial layer LHL and a second horizontal pattern SCP2 may be sequentially formed on the horizontal layer 150. The lower sacrificial layer LHL may include at least one of a silicon nitride layer and a silicon oxynitride layer. A mold structure MS may be formed on the second horizontal pattern SCP2. The mold structure MS may include alternately stacked insulating patterns ILD and sacrificial layers SL. The sacrificial layers SL may be formed of or include a material having an etch selectivity with respect to the insulating patterns ILD. For example, the sacrificial layers SL may include at least one of, for example, silicon nitride, silicon oxynitride, silicon carbide, and silicon germanium.

Figure 15A:
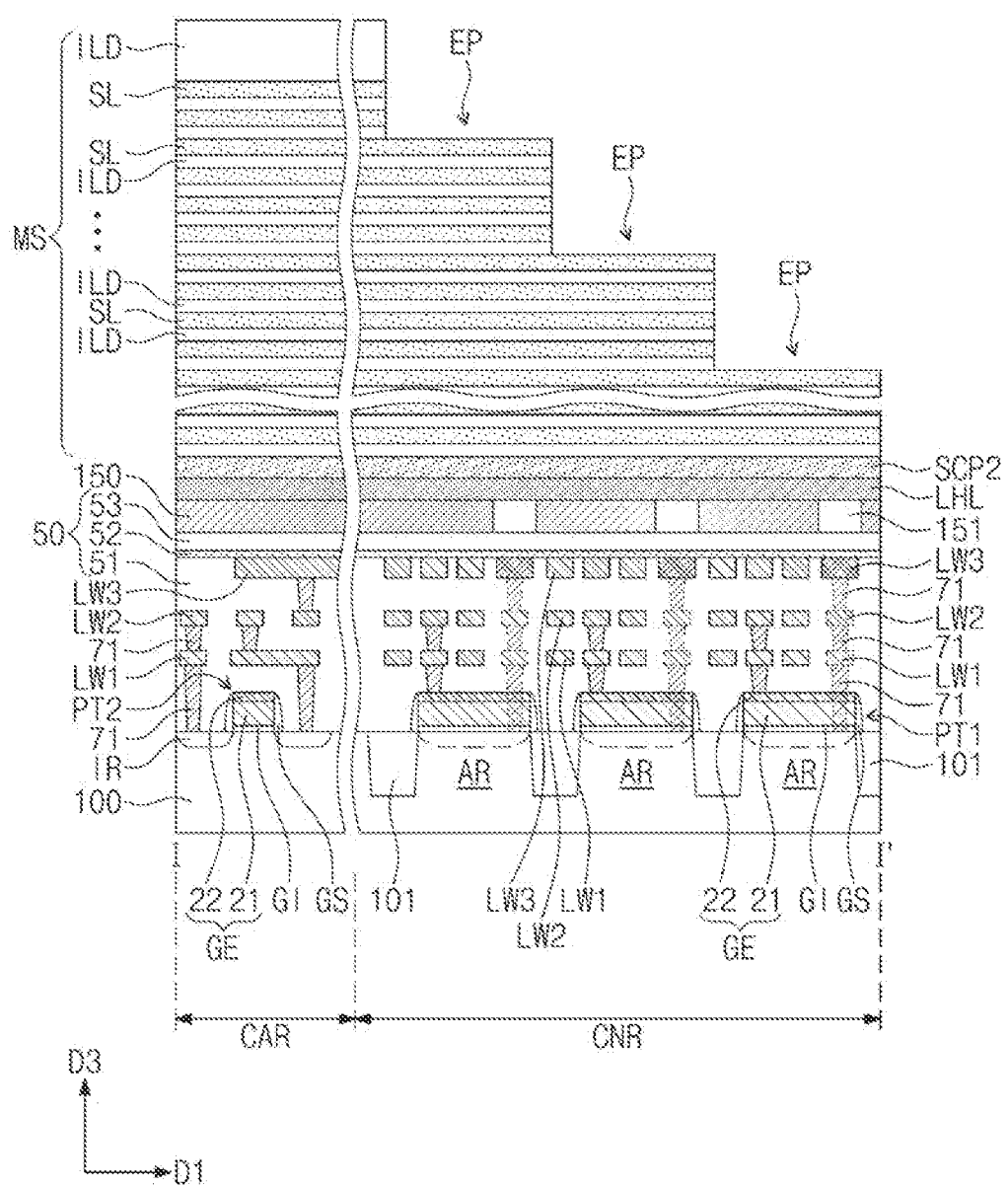
Figure 15B:
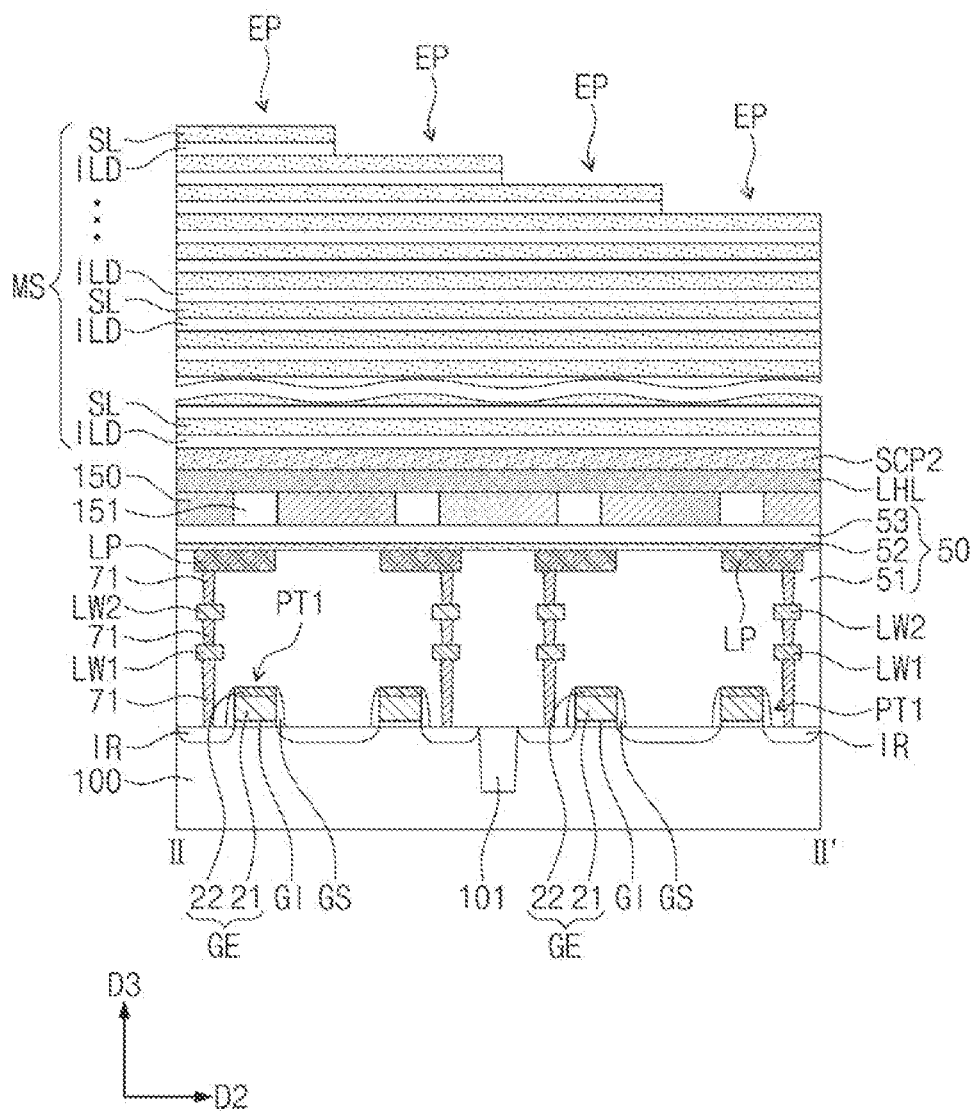

Referring to FIGS. 15A and 15B, the mold structure MS may be partially etched to form a staircase structure. In some embodiments, the partial etching of the mold structure MS may be performed using a trimming process. The trimming process may include forming a mask pattern to cover a portion of a top surface of the mold structure MS, patterning the mold structure MS using the mask pattern as an etch mask, reducing an area of the mask pattern, and patterning the mold structure MS using the mask pattern with the reduced area as an etch mask. In some embodiments, the steps of reducing the area of the mask pattern and patterning the mold structure MS using the mask pattern may be alternately repeated several times during the trimming process.

Preliminary pad portions EP may be formed in an upper portion of the staircase structure. The preliminary pad portions EP may be portions of the sacrificial layers SL not veiled by the insulating patterns ILD. However, respective levels of the preliminary pad portions EP may be lowered (or reduced) as a distance from a cell array region CAR is increased.

Figure 16A:
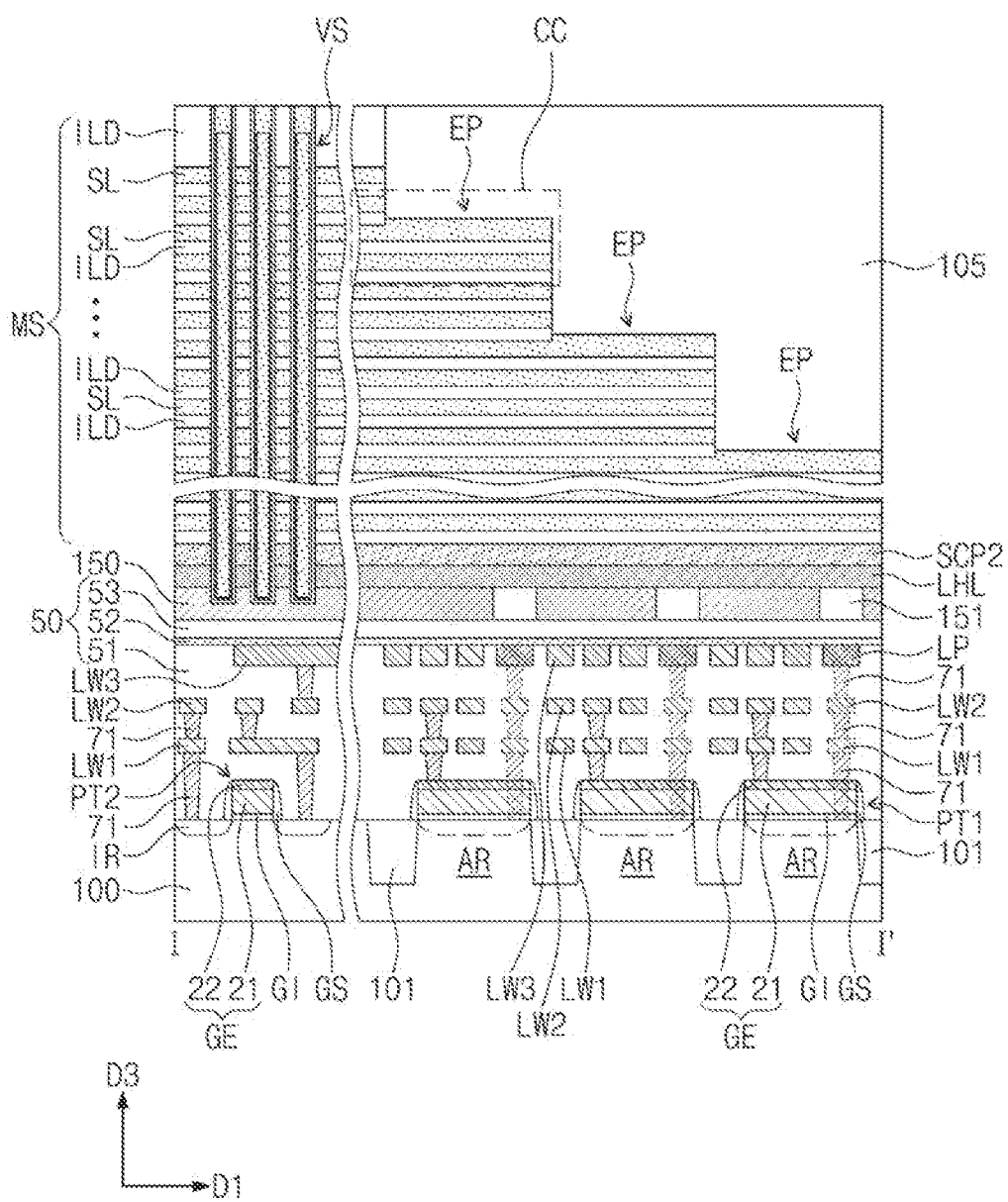
Figure 16B:
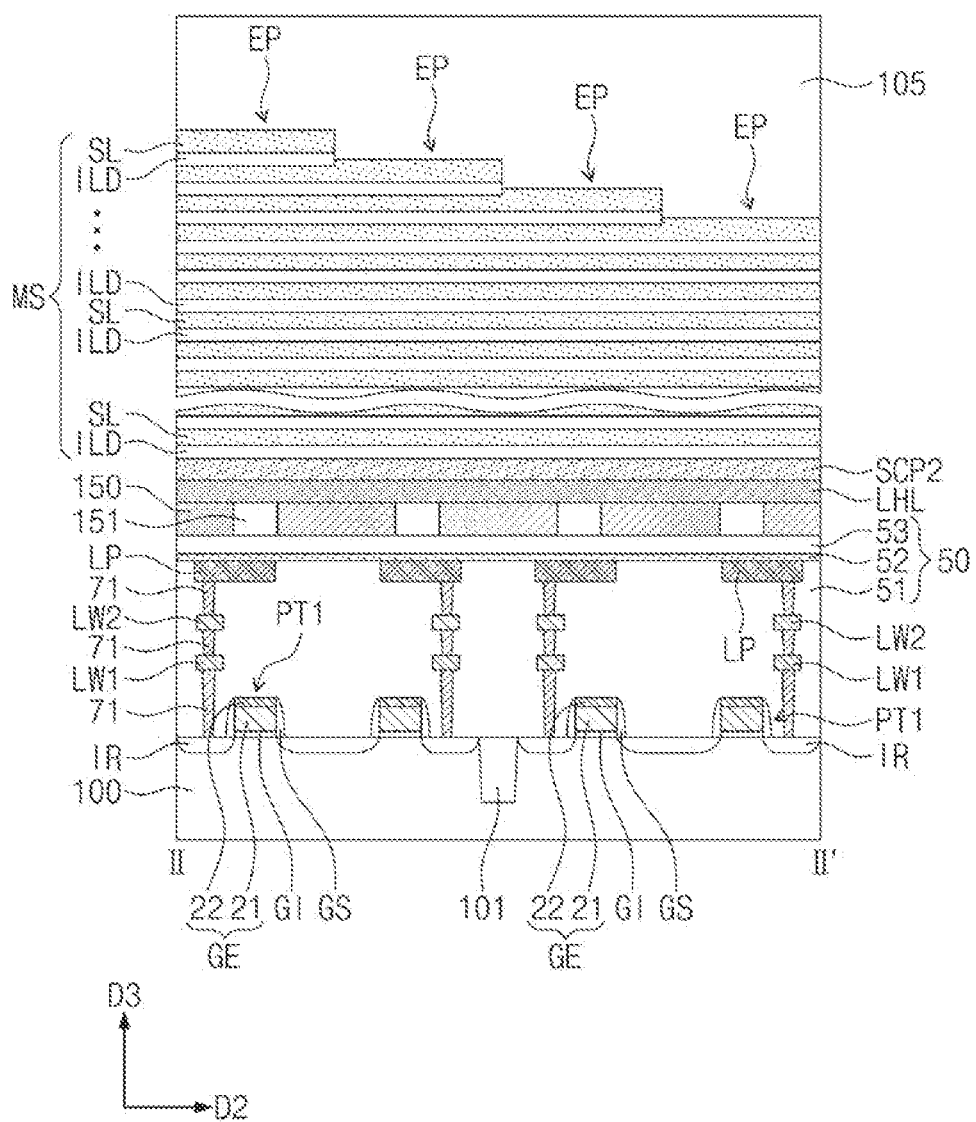

Referring to FIGS. 16A and 16B, a thickness of the preliminary pad portion EP may be increased. The increased thickness of the preliminary pad portion EP may be greater than a thickness of the sacrificial layer SL interposed between the insulating patterns ILD. An upper portion of the preliminary pad portion EP may protrude in a direction away from the substrate 100. A top surface of the preliminary pad portion EP may be disposed at a level between top and bottom surfaces of another insulating pattern ILD thereon. The increasing of the thickness of the preliminary pad portion EP may include depositing an upper sacrificial layer on the mold structure MS and partially removing the upper sacrificial layer to form upper sacrificial patterns remaining on top surfaces of the preliminary pad portions EP. The upper sacrificial pattern may be formed of or include the same material as the sacrificial layer SL.

After the thickening of the preliminary pad portion EP, a planarization insulating layer 105 may be formed on the connection region CNR to cover the staircase structure of the mold structure MS. The planarization insulating layer 105 may be formed to cover top and side surfaces of the preliminary pad portions EP. In some embodiments, a planarization process may be performed to provide a top surface of the planarization insulating layer 105 at the same level as the top surface of the mold structure MS.

Vertical structures VS may be formed on the cell array region CAR. The formation of the vertical structures VS may include forming vertical holes to penetrate the mold structure MS, the second horizontal pattern SCP2, and the lower sacrificial layer LHL and sequentially depositing a data storage pattern, a vertical semiconductor pattern, and a gapfill insulating pattern in the vertical holes. The vertical hole may be formed to have a bottom surface disposed at a level lower than the top surface of the horizontal layer 150. The data storage pattern may include sequentially stacked tunneling insulating layer, charge storing layer, and blocking insulating layer. The data storage pattern may be deposited on an inner sidewall of the vertical hole using a chemical vapor deposition (CVD) method and/or an atomic layer deposition (ALD) method. The vertical semiconductor pattern may be deposited on the data storage pattern using a CVD method and/or an ALD method to have a substantially uniform thickness. The gapfill insulating pattern may be formed on an inner side surface of the vertical semiconductor pattern to fill a remaining portion of the vertical hole. Bit line conductive pads may be formed in upper portions of the vertical holes. The bit line conductive pads may be impurity-doped regions or may be formed of a conductive material. The bit line conductive pad may be electrically connected to the vertical semiconductor pattern.

Figure 17A:
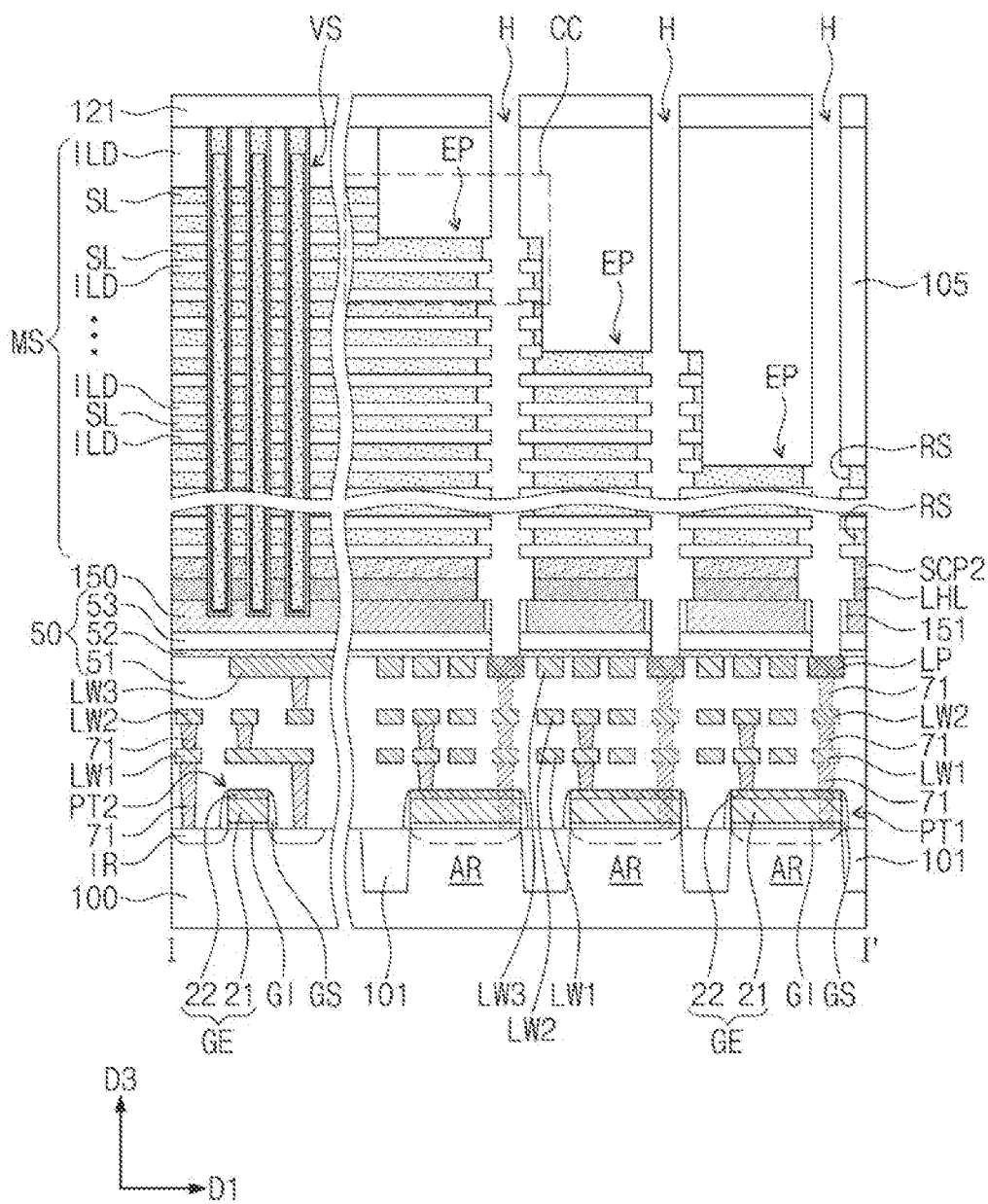
Figure 17B:
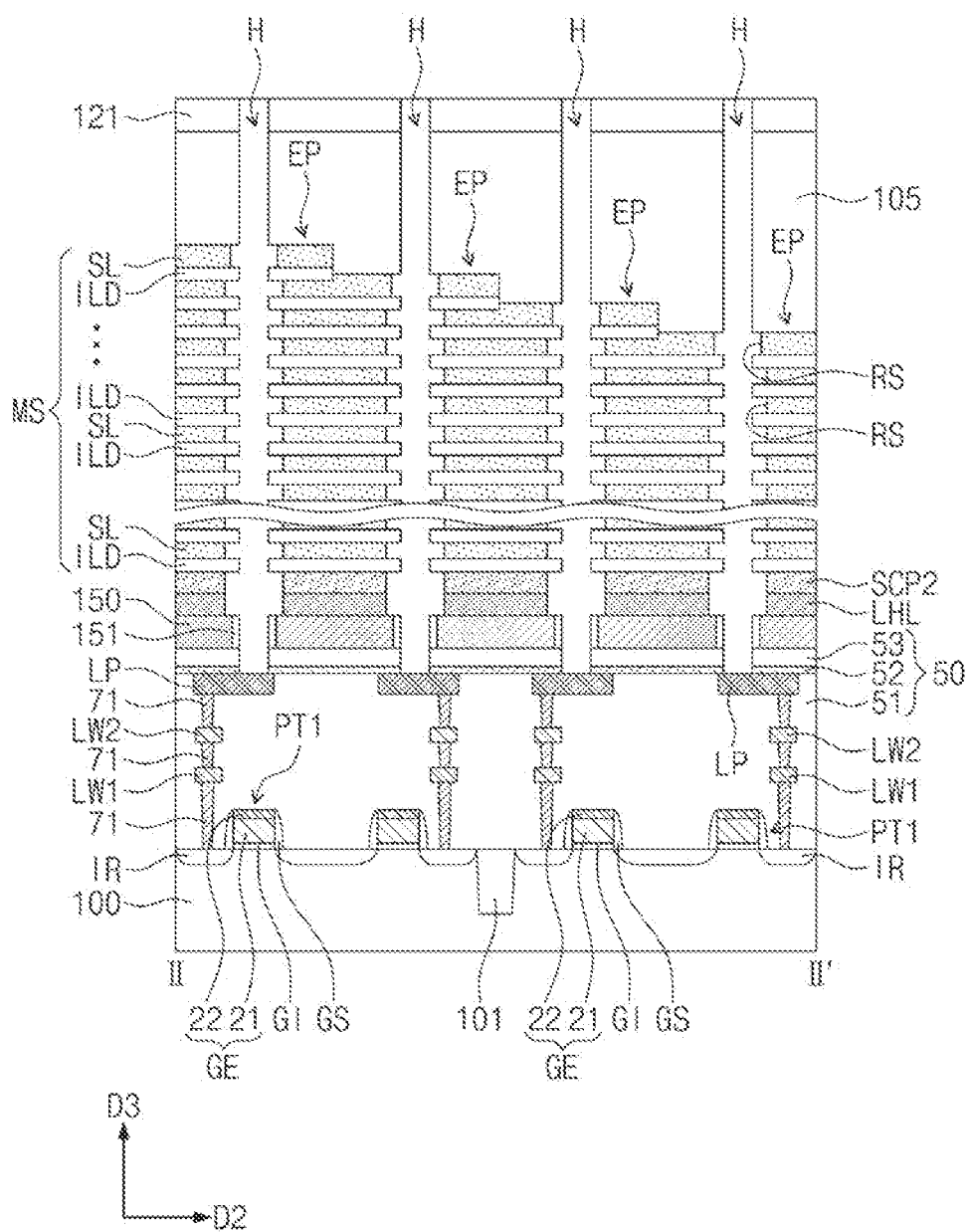

Referring to FIGS. 17A and 17B, a first interlayer insulating layer 121 may be formed to cover the mold structure MS. Next, penetration holes H may be formed to penetrate the first interlayer insulating layer 121, the mold structure MS, the second horizontal pattern SCP2, the lower sacrificial layer LHL, the lower insulating pattern 151, the second lower layer 52, and the third lower layer 53. The penetration holes H may penetrate the preliminary pad portions EP and to expose top surfaces of the landing pads LP. Bottoms of the penetration holes H may be defined by the landing pads LP.

Recess regions RS may be formed by partially removing the sacrificial layers SL, exposed through the penetration hole H. The formation of the recess regions RS may include performing a wet etching process using an etchant, which is chosen to have an etch selectivity with respect to the sacrificial layer SL. For example, the wet etching process may be a pull-back process using (e.g.) phosphoric acid ($H_3PO_4$). The recess regions RS formed at the same levels as the preliminary pad portions EP, may be shorter in horizontal length than the recess regions RS disposed below the preliminary pad portions EP.

Figure 18A:
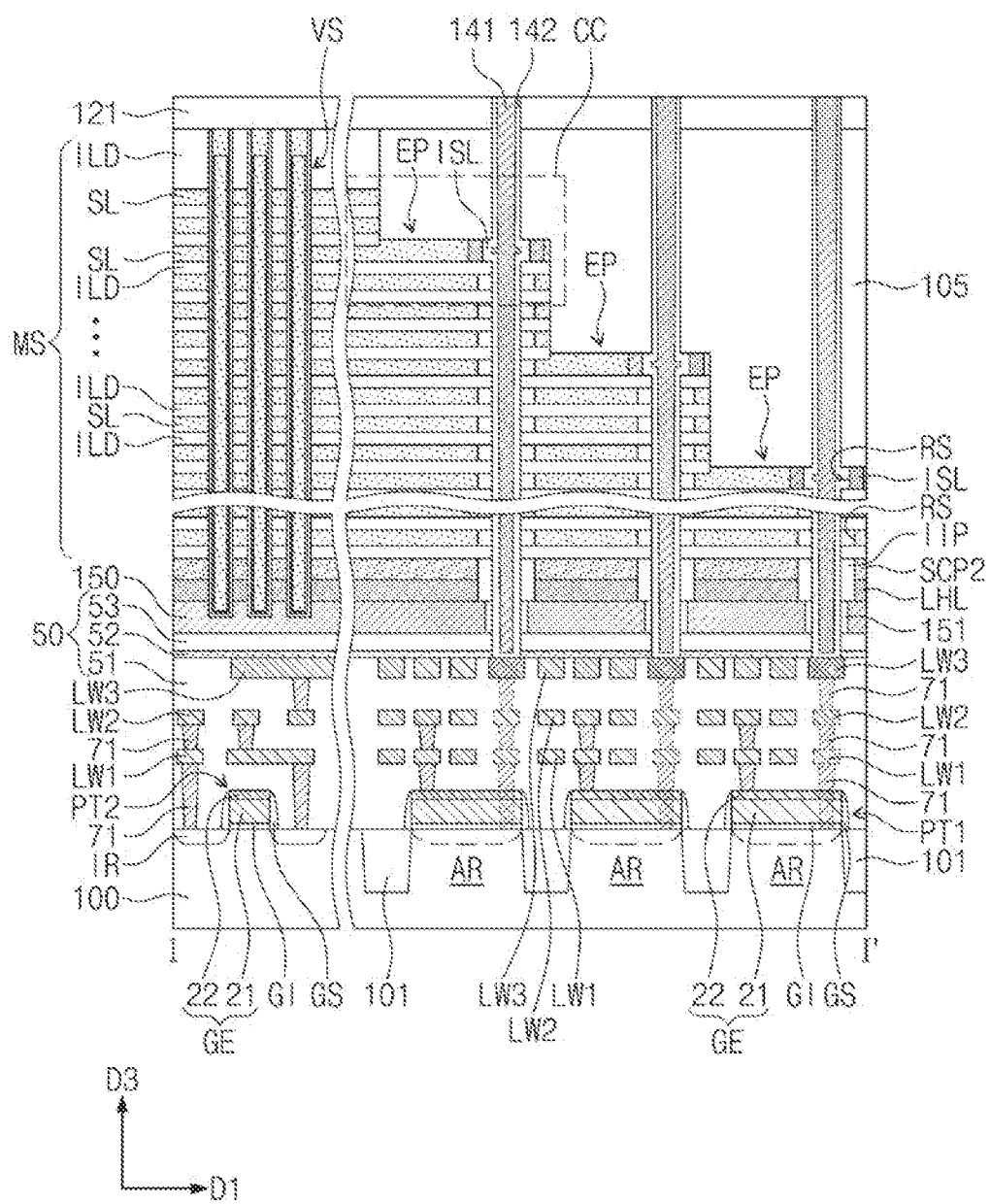
Figure 18B:
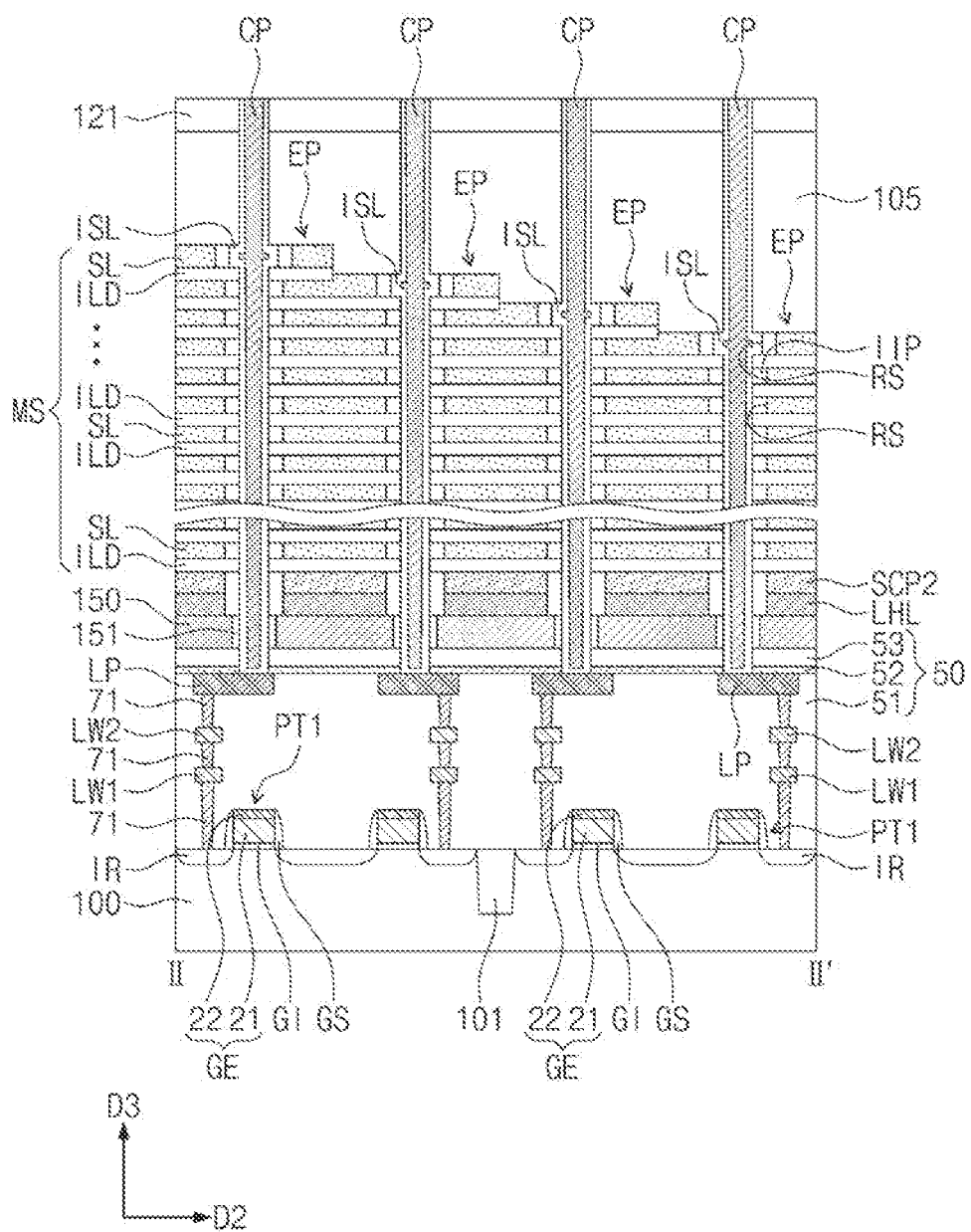

Referring to FIGS. 18A and 18B, penetration electrodes CP may be respectively formed in the penetration holes H. Inner insulating patterns IIP may be formed between the penetration electrode CP and the sacrificial layers SL. Protruding portions PP, which protrude toward side surfaces of the preliminary pad portions EP in a horizontal direction, may be formed during the formation of the penetration electrode CP.

Figure 19A:
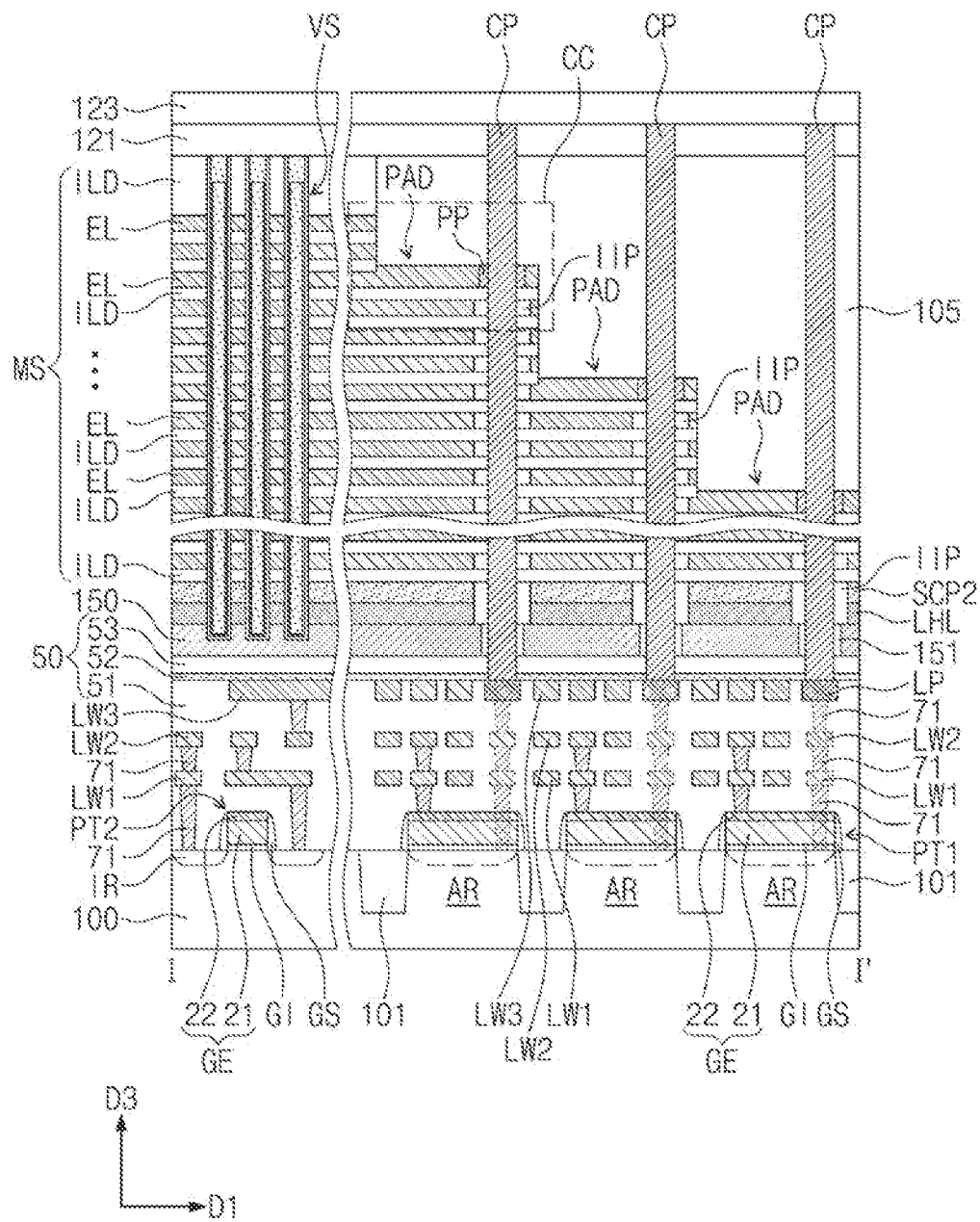
Figure 19B:
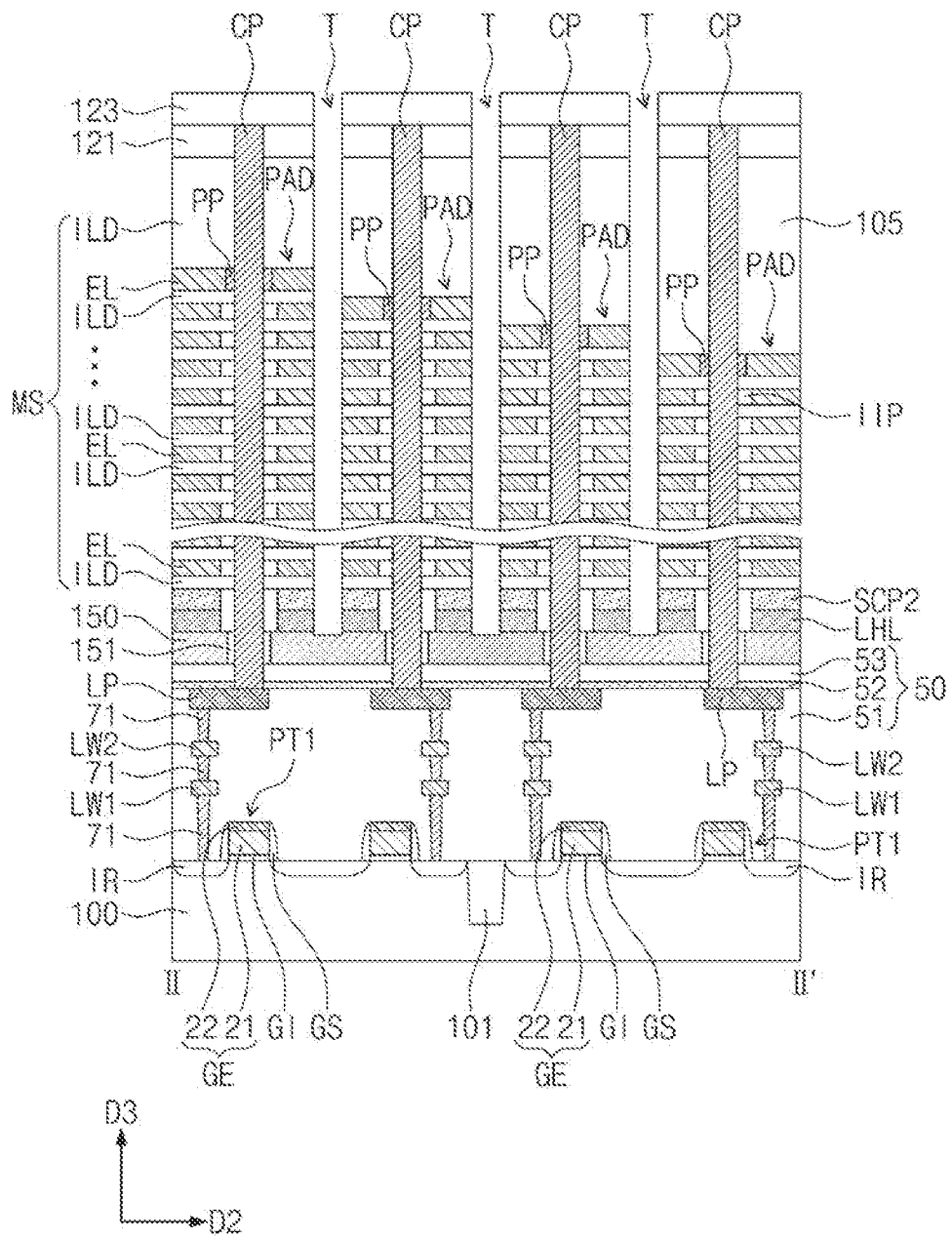

Referring to FIGS. 19A and 19B, trenches T may be formed to cross the mold structure MS. The trenches T may be formed to penetrate the second horizontal pattern SCP2 and the lower sacrificial layer LHL and may have bottom surfaces disposed at a level lower than the top surface of the horizontal layer 150.

Referring back to FIGS. 7A, 7B and 7C, a source structure SC may be formed by removing the lower sacrificial layer LHL and forming a first horizontal pattern SCP1 in a space, which is formed by removing the lower sacrificial layer LHL. Next, an electrode structure ST may be formed by removing the sacrificial layers SL and forming electrodes EL in spaces resulting from the removal of the sacrificial layers SL. Separation structures SS may be formed in the trenches T. Thereafter, bit lines BL and bit line contacts BCP may be formed.

Figure 20:
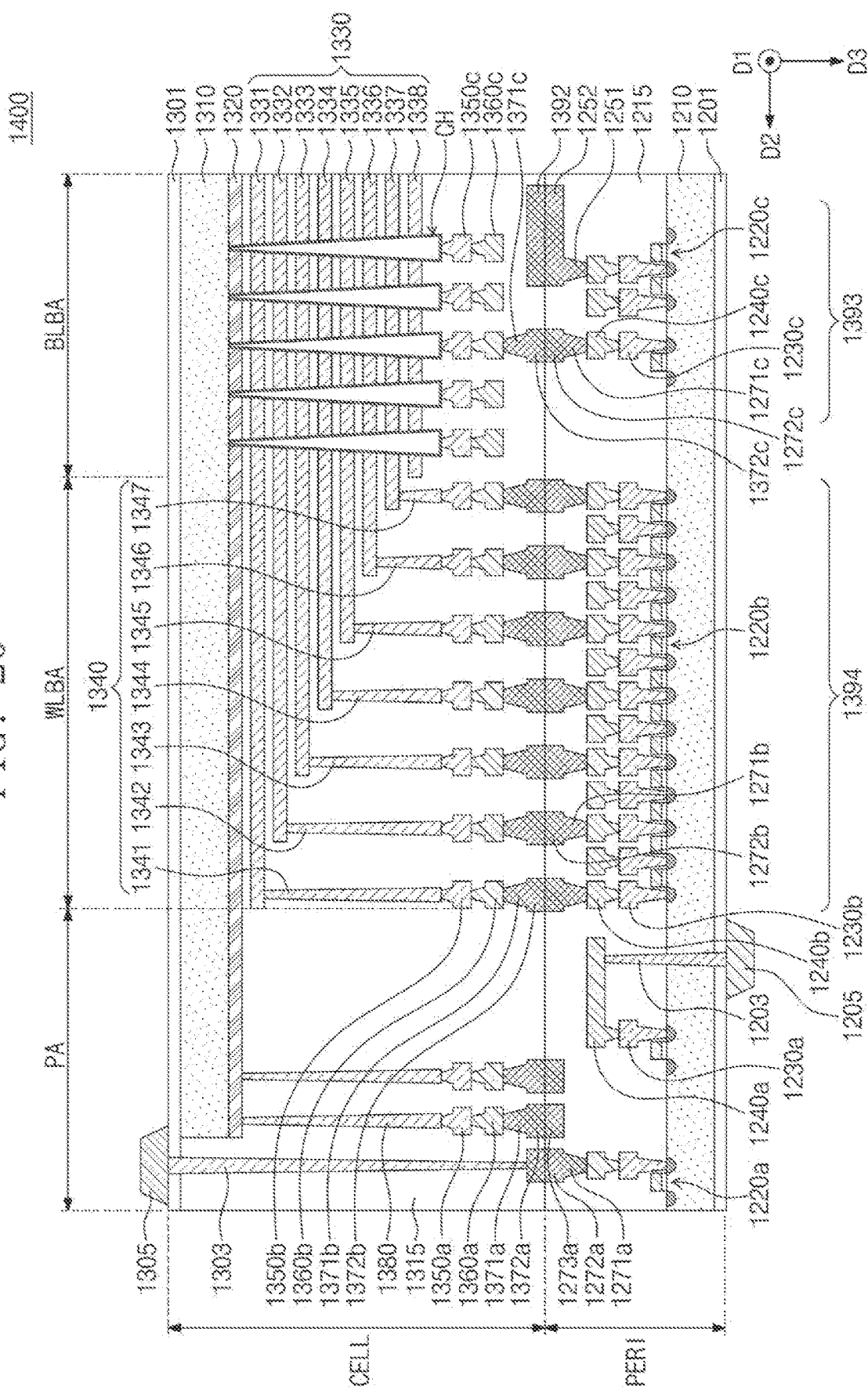
FIG. 20 is a cross-sectional view illustrating a semiconductor device according to embodiments of the inventive concept.

FIG. 20 is a cross-sectional view illustrating a semiconductor device 1400 according to embodiments of the inventive concept.

Referring to FIG. 20, the memory device 1400 may have a chip-to-chip (C2C) structure. In the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other through a bonding method. The bonding method may mean a way of electrically connecting a bonding metal formed in the uppermost metal layer of the upper chip to a bonding metal formed in the uppermost metal layer of the lower chip. For example, in the case where the bonding metal is formed of copper (Cu), the bonding method may be a Cu-to-Cu bonding method, but in some embodiments, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220a, 1220b, and 1220c formed on the first substrate 1210, first metal layers 1230a, 1230b, and 1230c connected to the circuit devices 1220a, 1220b, and 1220c, respectively, and second metal layers 1240a, 1240b, and 1240c formed on the first metal layers 1230a, 1230b, and 1230c. In some embodiments, the first metal layers 1230a, 1230b, and 1230c may be formed of or include a material (e.g., tungsten) having relatively high electric resistivity, and the second metal layers 1240a, 1240b, and 1240c may be formed of or include a material (e.g., copper) having relatively low electric resistivity.

Although only the first metal layers 1230a, 1230b, and 1230c and the second metal layers 1240a, 1240b, and 1240c are illustrated and described in the present specification, the inventive concept is not limited thereto and at least one metal layer may be further formed on the second metal layers 1240a, 1240b, and 1240c. At least one of the additional metal layers formed on the second metal layers 1240a, 1240b, and 1240c may be formed of a material (e.g., aluminum) having a lower electrical resistivity than the material (e.g., copper) of the second metal layers 1240a, 1240b, and 1240c.

The interlayer insulating layer 1215 may be disposed on the first substrate 1210 to cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide and silicon nitride).

Lower bonding metals 1271b and 1272b may be formed on the second metal layer 1240b of the word line bonding region WLBA. The word line bonding region WLBA may correspond to the connection region CNR described with reference to FIG. 5. In the word line bonding region WLBA, the lower bonding metals 1271b and 1272b of the peripheral circuit structure PERI may be electrically connected to upper bonding metals 1371b and 1372b of the cell array structure CELL through a bonding method, and the lower bonding metals 1271b and 1272b and the upper bonding metals 1371b and 1372b may be formed of or include at least one of aluminum, copper, or tungsten. The lower bonding metals 1271b and 1272b may include a pad portion 1272b and a plug portion 1271b.

The cell array structure CELL may include at least one memory block. The cell array structure CELL may include a second substrate 1310 and a common source line 1320. A plurality of electrodes 1331-1337 or 1330 may be stacked on the second substrate 1310 in a direction substantially perpendicular to a top surface of the second substrate 1310. The electrodes 1331-1337 or 1330 may correspond to the electrodes EL described with reference to FIGS. 3A, 3B, 4, 5, 6, 7A, 7B, 7C and 8. An upper electrode 1338 may be stacked on the electrodes 1331-1337 or 1330. The upper electrode 1338 may correspond to the uppermost one of the electrodes EL described with reference to FIGS. 3A, 3B, 4, 5, 6, 7A, 7B, 7C and 8.

A vertical structure VS may be provided in the bit line bonding region BLBA to extend in a direction substantially perpendicular to the top surface of the second substrate 1310 and to penetrate the electrodes 1330. The vertical structure VS may include a data storage layer, a channel layer, a gapfill insulating layer, and a pad. In the bit line bonding region BLBA, an upper channel structure UCS may penetrate the upper electrode 1338 to connect the vertical structure VS. The upper channel structure UCS may include an upper data storage layer, an upper channel layer, and an upper gapfill insulating layer, and the upper channel layer may be electrically connected to a first metal layer 1350c and a second metal layer 1360c. For example, the first metal layer 1350c may be a bit line contact, and the second metal layer 1360c may be a bit line.

A region, in which the vertical structure VS, the upper channel structure UCS, and the bit line 1360c are provided, may be defined as the bit line bonding region BLBA, and this region may correspond to the cell array region CAR described with reference to FIG. 5. The bit line 1360c may be electrically connected to the circuit devices 1220c disposed in the peripheral circuit structure PERI adjacent to the bit line bonding region BLBA to constitute a page buffer 1393. As an example, the bit lines 1360c may be connected to the peripheral circuit structure PERI through upper bonding metals 1371c and 1372c, and the upper bonding metals 1371c and 1372c may be connected to lower bonding metals 1271c and 1272c connected to the circuit devices 1220c of the page buffer 1393.

In the word line bonding region WLBA, the electrodes 1330 may extend in a second direction D2, which is parallel to the top surface of the second substrate 1310, and may be connected to a plurality of cell contact plugs 1341-1347 or 1340. The cell contact plugs 1340 may be connected to pads of the electrodes 1330 and extend with different lengths in the second direction D2. A first metal layer 1350b and a second metal layer 1360b may be provided on each of the cell contact plugs 1340, and may be connected to the electrodes 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In some embodiments, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220b constituting the row decoder 1394.

A common source line contact plug 1380 may be disposed in the outer pad bonding region PA. The common source line contact plug 1380 may be formed of a conductive material (e.g., metals, metal compounds, or polysilicon) and may be electrically connected to the common source line 1320. A first metal layer 1350a and a second metal layer 1360a may be sequentially stacked on the common source line contact plug 1380. A region, in which the common source line contact plug 1380, the first metal layer 1350a, and the second metal layer 1360a are provided, may be defined as the outer pad bonding region PA.

I/O pads 1205 and 1305 may be disposed in the outer pad bonding region PA. A lower insulating layer 1201 may be formed below the first substrate 1210 to cover the bottom surface of the first substrate 1210, and a first I/O pad 1205 may be formed on the lower insulating layer 1201. The first I/O pad 1205 may be connected to at least one of the circuit devices 1220a, 1220b, and 1220c of the peripheral circuit structure PERI through a first I/O contact plug 1203 and may be separated from the first substrate 1210 by the lower insulating layer 1201. In addition, a sidewall insulating layer (not shown) may be disposed between the first I/O contact plug 1203 and the first substrate 1210 to electrically separate the first I/O contact plug 1203 from the first substrate 1210.

An upper insulating layer 1301 may be formed on the second substrate 1310 to cover the top surface of the second substrate 1310, and a second I/O pad 1305 may be disposed on the upper insulating layer 1301. The second I/O pad 1305 may be connected to at least one of the circuit devices 1220a, 1220b, and 1220c of the peripheral circuit structure PERI through a second I/O contact plug 1303. For example, the second I/O pad 1305 may be electrically connected to the circuit device 1220a.

In some embodiments, the second substrate 1310 and the common source line 1320 may not be disposed in a region provided with the second I/O contact plug 1303. Furthermore, the second I/O pad 1305 may not be overlapped with the electrodes 1330 in a third direction D3. The second I/O contact plug 1303 may be separated from the second substrate 1310 in a direction parallel to the top surface of the second substrate 1310, may penetrate an interlayer insulating layer 1315 of the cell array structure CELL, and may be connected to the second I/O pad 1305.

In some embodiments, the first I/O pad 1205 and the second I/O pad 1305 may be selectively formed. As an example, the memory device 1400 may be configured to include only the first I/O pad 1205, which is provided on the first substrate 1210, or to include only the second I/O pad 1305, which is provided on the second substrate 1310. Alternatively, the memory device 1400 may be configured to include both of the first and second I/O pads 1205 and 1305.

A metal pattern, which is used as a dummy pattern, may be provided in the uppermost metal layer of the outer pad bonding region PA and the bit line bonding region BLBA included in each of the cell array structure CELL and the peripheral circuit structure PERI, but in some embodiments, such a dummy pattern may not be provided in the uppermost metal layer.

The memory device 1400 may include an upper metal pattern 1372a and a lower metal pattern 1273a provided in the outer pad bonding region PA, wherein the lower metal pattern 1273a may be formed in the uppermost metal layer of the peripheral circuit structure PERI to correspond to the upper metal pattern 1372a formed in the uppermost metal layer of the cell array structure CELL, and having the same shape as the upper metal pattern 1372a of the cell array structure CELL. The lower metal pattern 1273a, which is formed in the uppermost metal layer of the peripheral circuit structure PERI, may not be connected to any contact plug, in the peripheral circuit structure PERI. Similarly, in the outer pad bonding region PA, the upper metal pattern 1372a may be formed in the uppermost metal layer of the cell array structure CELL to correspond to the lower metal pattern 1273a, which is formed in the uppermost metal layer of the peripheral circuit structure PERI, and in this case, the upper metal pattern 1372a may have the same shape as the lower metal pattern 1273a of the peripheral circuit structure PERI.

The lower bonding metals 1271b and 1272b may be formed on the second metal layer 1240b of the word line bonding region WLBA. In the word line bonding region WLBA, the lower bonding metals 1271b and 1272b of the peripheral circuit structure PERI may be electrically connected to the upper bonding metals 1371b and 1372b of the cell array structure CELL through a bonding method.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In some embodiments, any contact plug may not be formed on the upper metal pattern 1392, which is formed in the uppermost metal layer of the cell array structure CELL.

According to an embodiment of the inventive concept, provided are a semiconductor device with improved reliability and increased integration density and an electronic system including the same.

While certain embodiments of the inventive concept have been particularly illustrated and described, those skilled in the art will recognize that variations in form and detail may be made therein without departing from the spirit and scope of the attached claims.

What is claimed is:
1. A semiconductor device, comprising:
a first transistor on a substrate and including a first gate electrode;
a second transistor on the substrate and including a second gate electrode adjacent to the first gate electrode in a first direction;
an electrode structure including electrodes vertically stacked on the first transistor and the second transistor, wherein the electrode structure includes a first pad and a second pad adjacent to each other in the first direction;
a first landing pad and a second landing pad between the substrate and the electrode structure, the first landing pad connected to the first transistor, and the second landing pad connected to the second transistor;
a first penetration electrode penetrating the electrode structure to connect the first landing pad and the first pad;
a second penetration electrode penetrating the electrode structure to connect the second landing pad and the second pad; and
lower interconnection lines between the first landing pad and the second landing pad and extending in a second direction perpendicular to the first direction,
wherein a length of the second landing pad in the second direction is less than a length of one of the lower interconnection lines in the second direction.

2. The semiconductor device of claim 1, wherein the lower interconnection lines are vertically overlapped by the second gate electrode.

3. The semiconductor device of claim 1, wherein a length of the second gate electrode in the first direction is greater than a length of the second gate electrode in the second direction.

4. The semiconductor device of claim 1, wherein a side surface of the first pad adjacent to the second pad is disposed between the first gate electrode and the second gate electrode.

5. The semiconductor device of claim 1, wherein the lower interconnection lines include a first lower interconnection line disposed at the same level as the first landing pad and the second landing pad.

6. The semiconductor device of claim 1, wherein the lower interconnection lines include a first lower interconnection line disposed at the same level as the first landing pad and the second landing pad, and a second lower interconnection line between the first lower interconnection line and the substrate, and
the first lower interconnection line is thicker than the second lower interconnection line.

7. The semiconductor device of claim 1, wherein the second transistor includes a source region and a drain region spaced apart in the second direction.

8. The semiconductor device of claim 1, further comprising:
a lower plug connecting the second gate electrode to at least one of the lower interconnection lines.

9. The semiconductor device of claim 1, further comprising:
an inner insulating pattern between the first penetration electrode and each of the electrodes of the electrode structure.

10. The semiconductor device of claim 1, wherein the second penetration electrode is vertically overlapped by the second gate electrode.

11. A semiconductor device, comprising:
a substrate including a cell array region and a connection region arranged in a first direction;
a device isolation layer on the connection region and defining a first active region and a second active region adjacent to each other in the first direction;
a first transistor on the first active region and including a first gate electrode;
a second transistor on the second active region and including a second gate electrode;
an electrode structure including electrodes vertically stacked on the cell array region and the connection region, wherein the electrode structure includes pads disposed on the connection region in a staircase structure, and the pads include a first pad on the first gate electrode and a second pad on the second gate electrode;
vertical channel structures on the cell array region and penetrating the electrode structure;
landing pads between the substrate and the electrode structure and including a first landing pad connected to the first transistor and a second landing pad connected to the second transistor;
a first penetration electrode penetrating the electrode structure to connect the first landing pad and the first pad;
a second penetration electrode penetrating the electrode structure to connect the second landing pad and the second pad;
lower interconnection lines between the first and second landing pads; and
a lower plug connecting the second transistor and at least one of the lower interconnection lines.

12. The semiconductor device of claim 11, wherein the lower interconnection lines extend in a second direction perpendicular to the first direction.

13. The semiconductor device of claim 11, wherein the lower interconnection lines include a first lower interconnection line disposed at the same level as the first landing pad and the second landing pad, and a second lower interconnection line between the first lower interconnection line and the substrate, and
the first lower interconnection line is thicker than the second lower interconnection line.

14. The semiconductor device of claim 11, further comprising:
a third transistor on the cell array region and including a third gate electrode,
wherein a length of the third gate electrode in the first direction is less than a length of the first gate electrode and a length of the second gate electrode.

15. The semiconductor device of claim 11, wherein a side surface of the first pad, adjacent to the second pad is disposed between the first gate electrode and the second gate electrode.

16. The semiconductor device of claim 11, wherein the second transistor include a source region and a drain region spaced apart in a second direction perpendicular to the first direction.

17. The semiconductor device of claim 11, wherein the lower interconnection lines are vertically overlapped by the second gate electrode.

18. An electronic system, comprising:
a main substrate;
a semiconductor device on the main substrate; and
a controller provided on the main substrate and electrically connected to the semiconductor device,
wherein the semiconductor device comprises:
a first transistor on a substrate and including a first gate electrode;
a second transistor on the substrate and including a second gate electrode adjacent to the first gate electrode in a first direction;
an electrode structure including electrodes vertically stacked on the first transistor and the second transistor, wherein the electrode structure includes a first pad and a second pad adjacent to each other in the first direction;

a first landing pad and a second landing pad between the substrate and the electrode structure, wherein the first landing pad is connected to the first transistor and the landing pad is connected to the second transistor;

a first penetration electrode penetrating the electrode structure to connect the first landing pad and the first pad;

a second penetration electrode penetrating the electrode structure to connect the second landing pad and the second pad; and lower interconnection lines between the first landing pad and the second landing pad, wherein a length of the second landing pad in the second direction is less than a length of one of the lower interconnection lines in a second direction perpendicular to the first direction.

19. The electronic system of claim 18, wherein the lower interconnection lines extends in the second direction.

* * * * *